(12) United States Patent
Garcia et al.

(10) Patent No.: US 8,667,672 B2
(45) Date of Patent: Mar. 11, 2014

(54) METHOD FOR PULLING AND CUTTING A Z-AXIS ELECTRICAL INTERCONNECTOR

(75) Inventors: Steven E. Garcia, Kemah, TX (US); Randall J. Boudreaux, Colorado Springs, CO (US)

(73) Assignee: Medallion Technology, LLC, Houston, TX (US)

( * ) Notice: Subject to any disclaimer, the term of this patent is extended or adjusted under 35 U.S.C. 154(b) by 697 days.

(21) Appl. No.: 12/685,902

(22) Filed: Jan. 12, 2010

(65) Prior Publication Data

US 2010/0107409 A1 May 6, 2010

Related U.S. Application Data

(62) Division of application No. 11/894,874, filed on Aug. 22, 2007, now Pat. No. 7,797,821.

(51) Int. Cl.
*H01R 43/20* (2006.01)

(52) U.S. Cl.
USPC .................................. 29/845; 29/747; 29/868

(58) Field of Classification Search
USPC ................ 29/868, 874–884, 747–749, 33 M; 72/409.14, 461, 751; 81/302, 421
See application file for complete search history.

(56) References Cited

U.S. PATENT DOCUMENTS

| 3,333,225 A | 7/1967 | McNutt |
| 4,165,557 A | 8/1979 | Taguchi et al. |
| 4,238,948 A | 12/1980 | Rose |
| 4,327,484 A | 5/1982 | Asai et al. |
| 4,356,619 A | 11/1982 | Snyder et al. |
| 4,356,626 A | 11/1982 | Waghorn |
| 4,378,632 A | 4/1983 | Ammon et al. |
| 4,677,734 A * | 7/1987 | Bloch et al. ................... 29/564.2 |
| 4,825,537 A * | 5/1989 | Berry et al. ...................... 29/747 |
| 4,936,011 A * | 6/1990 | Berry et al. ...................... 29/845 |
| 4,941,250 A | 7/1990 | Kusters |
| 4,941,252 A | 7/1990 | Haisch et al. |
| 5,331,867 A | 7/1994 | Carpenter et al. |
| 5,676,013 A | 10/1997 | Kahlau |

(Continued)

FOREIGN PATENT DOCUMENTS

| GB | 2045117 A | 10/1980 |
| GB | 2372884 A | 9/2002 |

OTHER PUBLICATIONS

PCT International Search Report and Written Opinion for International Application No. PCT/US2011/026684, dated Aug. 16, 2011, 12 pages.

*Primary Examiner* — Minh Trinh
(74) *Attorney, Agent, or Firm* — John R. Ley

(57) ABSTRACT

A connection portion of a z-axis interconnector is assembled into contact with a plurality of aligned vias in a corresponding plurality of stacked printed circuit boards by gripping and pulling a leader portion of the interconnector connected to the connection portion, to move the interconnector into the final position with the connection portion contacting the aligned vias. The leader portion is severed from the connection portion after the interconnector is moved into the final position. A single pulling and cutting tool which accomplishes these functions preferably does so by a single pinch and cut device having opposing blades which partially penetrate into the leader portion to grip the leader portion, which fully penetrated through the leader portion to sever the leader portion, and which are moved toward and away from the plurality of stacked printed circuit boards to pull the interconnector and to reposition for severing the leader portion.

13 Claims, 27 Drawing Sheets

(56) References Cited

U.S. PATENT DOCUMENTS

| | | |
|---|---|---|
| 6,240,614 B1 | 6/2001 | Kojima et al. |
| 6,584,677 B2 | 7/2003 | Garcia et al. |
| 7,191,525 B2 | 3/2007 | Brailovskiy |
| 2002/0108241 A1 | 8/2002 | Garcia et al. |
| 2002/0108985 A1 | 8/2002 | Garcia et al. |
| 2009/0049684 A1 | 2/2009 | Garcia et al. |
| 2010/0175252 A1 | 7/2010 | Garcia et al. |

* cited by examiner

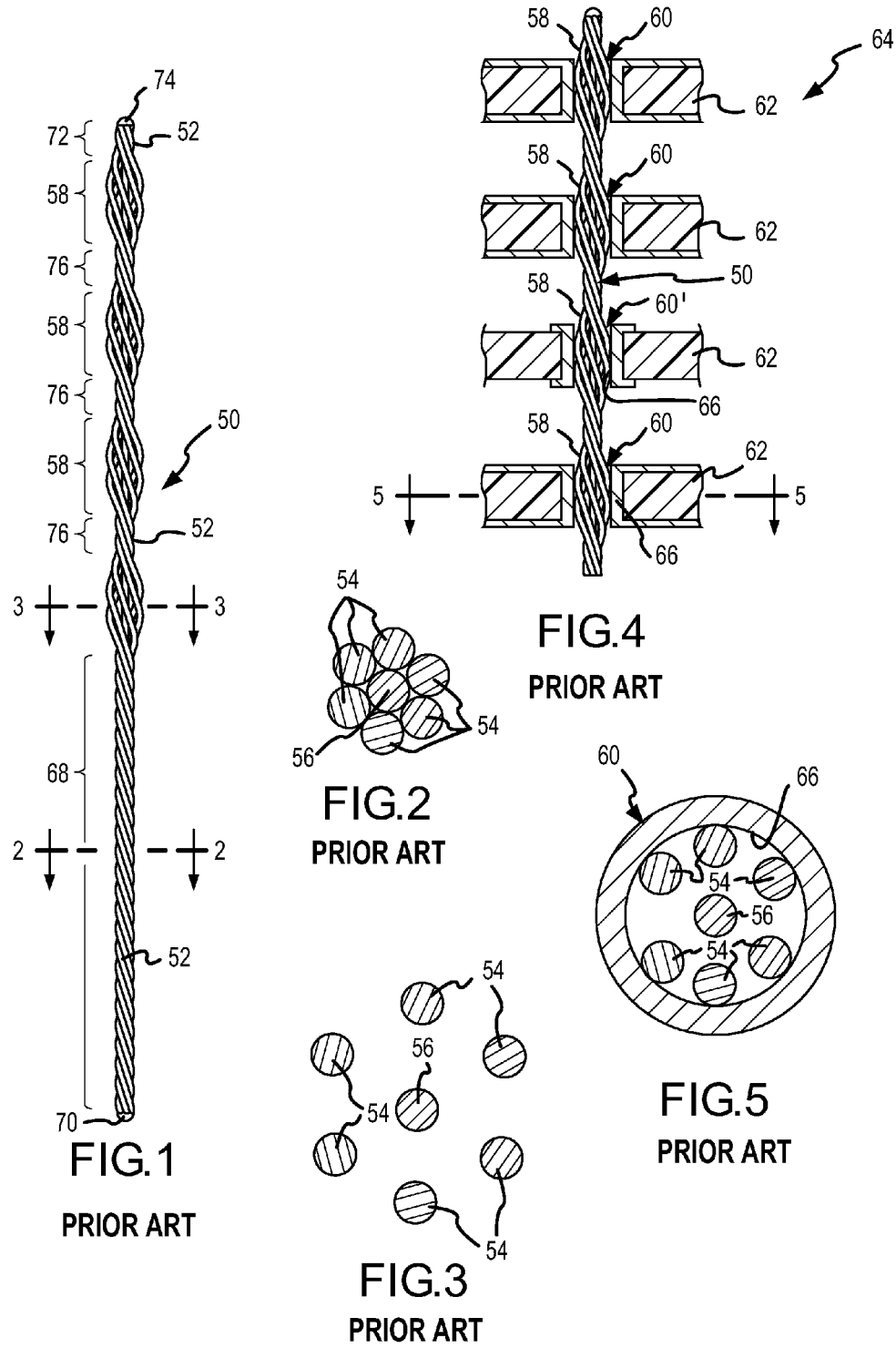

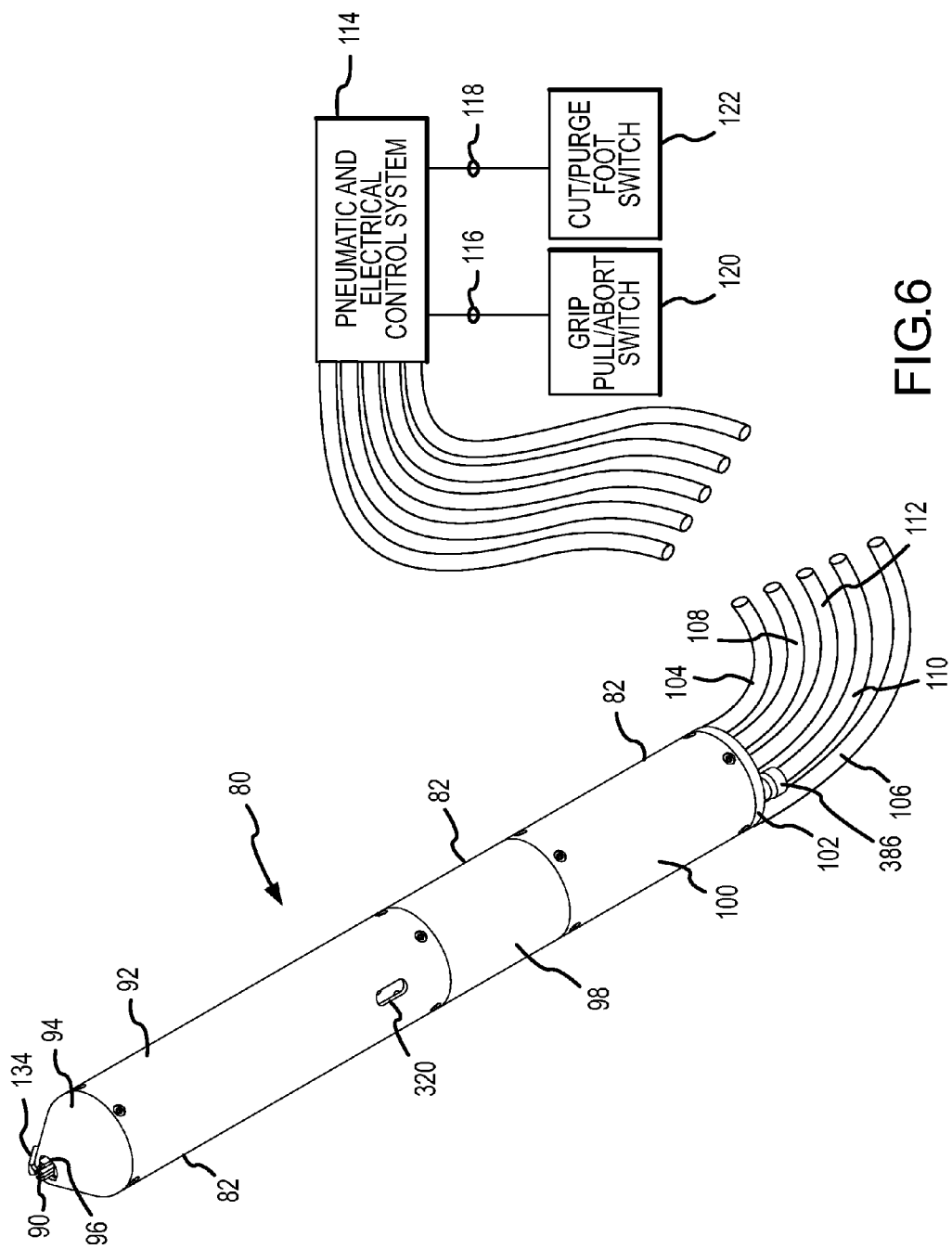

METHOD FOR PULLING AND CUTTING A Z-AXIS ELECTRICAL INTERCONNECTOR

CROSS REFERENCE TO RELATED APPLICATION

This is a division of application Ser. No. 11/894,874, filed Aug. 22, 2007, now U.S. Pat. No. 7,797,821.

FIELD OF THE INVENTION

This invention relates to assembling three-dimensional electronic modules, and more particularly to a new and improved tool and method for pulling z-axis interconnectors into predetermined positions between circuit boards of the module and thereafter cutting off an excess portion of each the z-axis interconnector in a single sequence of operations executed rapidly and efficiently to mechanically and electrically connect the circuit boards and assemble the module. The z-axis interconnectors are preferably twist pins, which are of the type, and are used in the manner, described in U.S. Pat. Nos. 4,955,523, 5,014,419, 5,054,192, 5,045,975, 5,112,232, 5,184,400, 5,189,507, 5,195,237, 6,528,759, 6,530,511, 6,584,677, 6,716,038, 6,729,026 and 6,971,415, all of which are owned by the assignee of the present invention. The subject matter of these prior patents is incorporated herein by this reference.

BACKGROUND OF THE INVENTION

The evolution of computer and electronic systems has demanded ever-increasing levels of performance. In most regards, the increased performance has been achieved by electronic components of ever-decreasing physical size. The diminished size itself has been responsible for some level of increased performance because of the reduced lengths of the paths through which the signals must travel between separate components of the systems. Reduced length signal paths allow the electronic components to switch at higher frequencies and reduce the latency of the signal conduction through relatively longer paths.

One technique of reducing the size of the electronic components is to condense or diminish the space between the electronic components. A diminished size also allows more components to be included in a system, which is another technique of achieving increased performance because of the increased number of components.

A particularly effective approach to condensing the size between electronic components is to attach multiple semiconductor integrated circuits or "chips" on printed circuit boards, and then stack multiple printed circuit boards to form a three-dimensional configuration or module. Z-axis interconnectors are extended vertically, in the z-axis dimension, between the vertically stacked printed circuit boards, each of which is oriented in the horizontal x-axis and y-axis dimensions. The interconnectors, in conjunction with conductor traces of each printed circuit board, connect the chips of the module with short signal paths. The relatively high concentration of chips, which are connected by the three-dimensional, relatively short length signal paths, are capable of achieving very high levels of functionality.

The z-axis interconnectors contact and extend through plated through holes or "vias" formed in each of the printed circuit boards. The chips of each printed circuit board are connected to the vias by conductor traces formed on or within each printed circuit board. The vias are formed in each individual printed circuit board of the three-dimensional modules at similar locations, so that when the printed circuit boards are stacked in the three-dimensional module, the vias of all of the printed circuit boards are aligned vertically in the z-axis. The z-axis interconnectors are then inserted vertically through the vertically aligned vias to establish an electrical contact and mechanical connection between the circuit boards, thus assembling the module.

A number of different types of z-axis interconnectors have been proposed. One particularly advantageous type of z-axis interconnector is known as a "twist pin." An example of a prior art twist pin 50 is shown in FIG. 1. The twist pin 50 is formed from a length of wire 52 which has been formed conventionally by helically coiling a number of outer strands 54 around a center core strand 56 in a planetary manner, as shown in FIG. 2. At selected positions along the length of the wire 52, a bulge 58 is formed by untwisting the outer strands 54 in a reverse or anti-helical direction. As a result of untwisting the strands 54 in the anti-helical direction, the space consumed by the outer strands 54 increases, causing the outer strands 54 to bend or expand outward from the center strand 56 and create a larger diameter for the bulge 58 than the diameter of the regular stranded wire 52. The laterally outward extent of the bulge 58 is illustrated in FIG. 3, compared to FIG. 2. The strands 54 and 56 of the wire 52 have the necessary mechanical characteristics to maintain the shape of the wire in the stranded configuration and to allow the outer strands 54 to bend outward at each bulge 58 when untwisted.

The bulges 58 are formed at selected predetermined distances along the length of the wire 52 to contact vias 60 in printed circuit boards 62 of a three-dimensional module 64, as shown in FIG. 4. Contact of the bulge 58 with the vias 60 is established by pulling the twist pin 50 through an aligned vertical column of vias 60. The outer strands 54 of the wire 52 have sufficient resiliency characteristics so that the outward protruding bulge 58 resiliently presses against an inner surface of a sidewall 66 of each via 60, thereby establishing the electrical and mechanical connection between the twist pin 50 and the via 60, as shown in FIG. 5.

To insert the twist pins 50, a leader 68 is extended through the vertically aligned vias 60 of the vertically stacked printed circuit boards 62 (see FIG. 8). The strands 54 and 56 at a terminal end 70 of the leader 68 have been welded or fused together to form a rounded end configuration 70 to facilitate insertion of the twist pin 50 through the column of vertically aligned vias. The leader 68 is of sufficient length to extend through all of the vertically aligned vias 60 of the assembled stacked printed circuit boards 62, before the bulge 58 which adjoins the leader 68 makes contact with the uppermost via 60 of the outermost printed circuit board 62. The terminal end 70 of the leader 68 extends below the lowermost one of the vertically aligned vias of the lowermost printed circuit board 62.

The terminal end 70 of the leader 68 is gripped from below and is pulled downwardly, causing the bulges 58 to move downwardly through the vertically aligned vias 60 until the bulges 58 are all aligned and in contact with the vias 60 of the stacked printed circuit boards. To position the bulges in contact with the vertically aligned vias, the lower leading bulges 58 closest to the leader 68 are pulled into and out of the vertically aligned vias until the twist pin 50 arrives at its final desired and assembled position. The resiliency of the bulges 58 allows them to move in and out of the vias 60 without losing their ability to make firm contact with the sidewall of the via in the final assembled position. Once the twist pin is in the final assembled position, the leader 68 is cut off flush or sub-flush at a predetermined length which is slightly beyond the lower surface of the lower printed circuit board of the module 64, for example no greater than 0.015 inch beyond the lower surface.

A tail 72 at the other end of the twist pin 50 extends a short distance above the upper trailing bulge 58. The strands 54 and 56 at an end 74 of the tail 72 are also fused together. The length of the tail 72 positions the other end 74 of the twist pin 50 at a similar position above the upper circuit board compared to the position where the leader 68 was cut off relative to the lower circuit board. Allowing the tail 72 and the remaining portion of the leader 68 to extend slightly beyond the outer printed circuit boards 62 of the module 64 facilitates gripping the twist pin 50 when removing it from the module 64 to repair or replace any defective components.

The twist pins are typically of a very small size. The most common sizes of strands 54 and 56 of the helically-coiled wire 52 used is to form twist pins 50 are about 0.0016, 0.0033 and 0.0050 in. in diameter. The diameters of the coiled strands of the wire 52 formed from the these sizes of strands 54 and 56 are 0.005, 0.0010, and 0.0015 in., respectively. The typical length of a twist pin having four to six bulges which extends through four to six printed circuit boards will be about 1 to 1.5 inches, with the leader constituting about half of this length. The outer diameter of each bulge 58 will be approximately two to three times the diameter of the stranded wire 52 in the intervals 76. The tolerance for locating the bulges 58 between intervals 76 is in the neighborhood of 0.002 in. The weight of a typical four-bulge twist pin is about 0.0077 grams, making it so light that handling the twist pin is very difficult. It is not unusual that a complex module formed by 4 in. by 4 in. printed circuit board 62 may require the use of as many as 22,000 twist pins. Thus, the relatively large number of twist pins necessary to assemble each three-dimensional module necessitates an ability to pull each twist pin into the desired position and to cut the leader off in an efficient and rapid manner.

The common technique for pulling and cutting the twist pins involves gripping the protruding end 70 of the leader 68 with one machine and pulling the leader downward. Thereafter, a separate machine moves in from the side and cuts the leader. For a large number of twist pins to be assembled efficiently in a relatively short amount of time, the movements of the separate pulling machine and cutting machine must be coordinated with one another. Coordinating the functionality of two independently operating machines is difficult, and generally requires very complex electronic sensors and controllers. Furthermore, because the operation of the pulling and cutting machines are independent of one another, the functionality of one machine may adversely influence the proper functionality of the other machine. Such prior art pulling and cutting machines are relatively large devices which are intended to be used in a stationary manner. The stacked printed circuit boards must be positioned and oriented relative to the stationary machines. Consequently, it is impossible, expensive or extremely inconvenient to assemble three-dimensional circuit modules other than by use of this type of assembly-line equipment. The expense of programming the separate stationary machines is not conducive to the use of the z-axis interconnectors to assemble relatively smaller numbers of modules.

These and other considerations pertinent to the fabrication of twist pins have given rise to the new and improved aspects of the present invention.

SUMMARY OF THE INVENTION

The present invention combines the pulling and cutting functions necessary to assemble a z-axis interconnector into vias of a plurality of stacked printed circuit boards in a series of sequentially-executed operations. The operations involved in pulling and cutting the z-axis interconnector are conveniently executed by a single, relatively small and hand-manipulated mobile machine. The pulling and cutting operations are interrelated so that each z-axis interconnector is assembled in a reliable, consistent and efficient manner. The relatively small size of the pulling and cutting tool allows it to be manipulated by hand, so that an individual can create three-dimensional circuit modules without using large, immobile, expensive and separate assembly-line machines which must be coordinated in functionality with a complex control system. Instead, the present invention is capable of implementation as a hand tool, while still obtaining all the precision and functionality necessary to assemble z-axis interconnectors into a three-dimensional electronic module. The invention can also be implemented as a stationary tool for use in an assembly line if desired, for example.

These and other improvements are accomplished by a method of assembling a z-axis interconnector into a plurality of aligned vias in a corresponding plurality of stacked printed circuit boards. The interconnector has a leader portion which extends through the aligned vias when starting to assemble the interconnector, and also has a connection portion which contacts the aligned vias upon finishing the assembly of the interconnector. The method comprises gripping and pulling the leader portion to move the interconnector into the final position with the connection portion contacting the aligned vias, severing the leader portion from the connection portion after the interconnector is moved into the final position, and accomplishing the gripping, pulling and severing with one pinch and cut device.

The method preferably comprises inserting the leader portion of the z-axis interconnector through the aligned vias to establish a starting position in which a terminal end of the leader portion extends beyond an outer one of the plurality of printed circuit boards, gripping the terminal end of the leader portion with a pinch and cut device when the z-axis interconnector is in the starting position, pulling the leader portion to move the connection portion of the z-axis interconnector through the plurality of aligned vias to a final position in which the connection portion contacts the aligned vias by moving the pinch and cut device away from the outer one of the printed circuit boards while gripping the terminal end of the leader portion with the pinch and cut device, releasing the grip on the terminal end of the leader portion with the pinch and cut device after the z-axis interconnector is in the final position, positioning the pinch and cut device adjacent to the outer one of the printed circuit boards after the z-axis interconnector has been pulled into the final position and after the grip on the terminal end of the leader portion is released, and thereafter severing the leader portion from the connector portion at a position adjacent to the outer one of the printed circuit boards by use of the pinch and cut device.

Certain other preferable aspects of the method include the following: using opposing blades to penetrate partially into the leader portion to grip the leader portion and to penetrate completely through the leader portion to sever the leader portion; separating the opposing blades laterally away from the leader portion to release the grip on the leader portion and prior to gripping the leader portion and after severing the leader portion; using pressurized fluid to move the opposing blades into the partially penetrated, fully penetrated and laterally separated positions and to move the pinch and cut device away from the outer one of the printed circuit boards while gripping the leader portion and to position the pinch and cut device adjacent to the outer one of the printed circuit boards after the z-axis interconnector has been pulled into the final position and after releasing the grip on the leader portion; transporting the severed leader portion away from the connection portion immediately after severing the leader portion and collecting a plurality of severed leader portions in a single location which is separated from the pinch and cut device; inserting at least a segment of the leader portion into a conduction tube upon positioning the pinch and cut device adjacent to the outer one of the printed circuit boards after the z-axis interconnector has been pulled into the final position; and using jaw members with opposing blades of the pinch and cut device to grip the leader portion and contacting the jaw members with a deflection mechanism to move the opposing blades laterally toward one another to grip the leader portion.

The method is advantageously executed when the pinch and cut device is part of a tool which comprises a pair of blades that move laterally toward and away from one another and longitudinally toward and away from an outer one of the plurality of stacked printed circuit boards to execute a sequence in which the leader portion is gripped, the leader portion is pulled a predetermined distance to position the connection portion in contact with the aligned vias, and the leader portion is severed from the connection portion at a location adjacent to the outer one of the plurality of printed circuit boards.

The tool preferably comprises a gripping and cutting subassembly and a longitudinal movement subassembly. The gripping and cutting subassembly includes a pair of blades and a first actuator connected to the blades to move the blades laterally toward and away from one another. The longitudinal movement subassembly is connecting to the gripping and cutting assembly and includes a second actuator connected to move the blades longitudinally toward and away from an outer one of the plurality of stacked printed circuit boards. A control system is connected to the tool and to the first and second actuators and operative to control the first and second actuators to move the blades laterally toward one another to penetrate into opposite sides of the leader portion and grip the leader portion without severing the leader portion, to move the blades longitudinally away from the outer one of the printed circuit boards to pull the interconnector a predetermined distance which positions the connection portion in the final position contacting the vias while the leader portion is gripped by the blades, to move the blades laterally away from one another to separate the blades laterally from the leader portion and release the grip on the leader portion after the interconnector is pulled into in the final position, to move the blades longitudinally toward the printed circuit boards to return the blades to a predetermined location adjacent to the outer one of the printed circuit boards while the blades are separated laterally from the leader portion, and to move the blades laterally toward one another to penetrate into the opposite sides of the leader portion sufficiently to sever the leader portion from the connection portion at the predetermined location.

A more complete appreciation of the present invention and its scope may be obtained from the accompanying drawings, which are briefly summarized below, from the following detailed descriptions of presently preferred embodiments of the invention, and from the appended claims.

BRIEF DESCRIPTION OF THE DRAWINGS

FIG. 1 is a side elevational view of a prior art twist pin.

FIG. 2 is an enlarged, cross-sectional view of the twist pin shown in FIG. 1, taken substantially in the plane of line 2-2 in FIG. 1.

FIG. 3 is an enlarged, cross-sectional view of the twist pin shown in FIG. 1, taken substantially in the plane of line 3-3 in FIG. 1.

FIG. 4 is a partial, vertical cross-sectional view of a prior art three-dimensional module, formed by multiple printed circuit boards and illustrating a fully inserted position of single twist pin of the type shown in FIG. 1 extending through vertically aligned vias of the printed circuit boards of the module.

FIG. 5 is an enlarged cross-sectional view of the twist pin within a via shown in FIG. 4, taken substantially in the plane of line 5-5 in FIG. 4.

FIG. 6 is a perspective view of a pulling and cutting tool, and a schematic view of a pneumatic and electrical control system for the tool, in which aspects of the present invention are embodied.

DETAILED DESCRIPTION

In General

Figure 7:
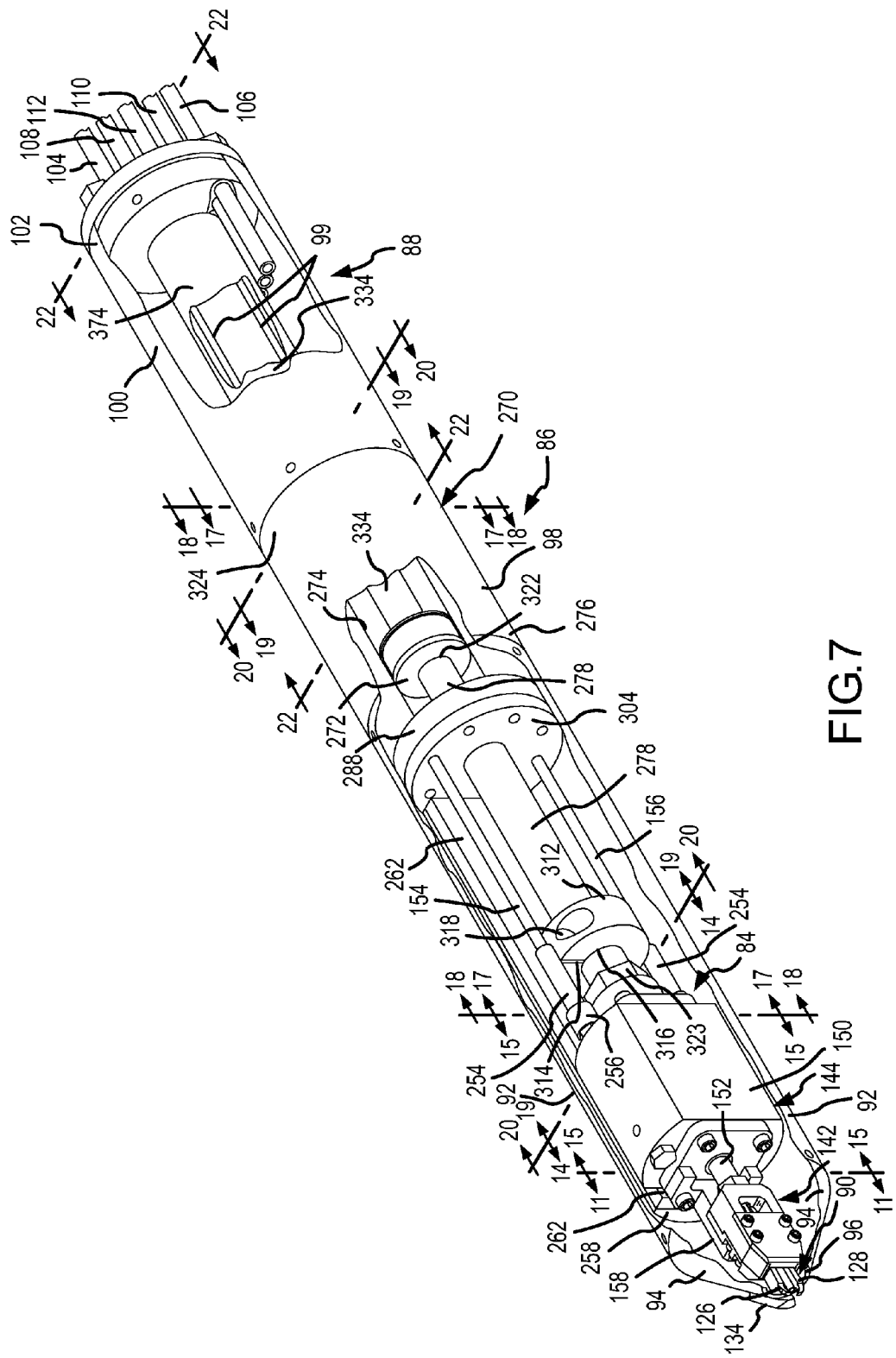
FIG. 7 is an enlarged perspective view of the tool shown in FIG. 6, with certain portions broken away to reveal a gripping and cutting subassembly, a longitudinal movement subassembly, and a pneumatic interface and leader collection subassembly of the tool.

A twist pin pulling and cutting tool 80 incorporating the present invention is shown in FIGS. 6 and 7. The tool includes a housing 82, within which a gripping and cutting subassembly 84, a longitudinal movement subassembly 86 and a pneumatic interface and leader collection subassembly 88 are located. The gripping and cutting subassembly 84 includes a pinch and cut blade 90 located at a forward end thereof. A front shell 92 of the housing 82 generally covers the gripping and cutting subassembly 84, as shown in FIG. 7. A conically shaped front end cap 94 attaches to the front shell 92, and an opening 96 is formed in the front end cap 94 to permit the pinch and cut blade 90 to extend from the housing 82 and interact with the leader 68 of the twist pin 50 (FIGS. 1 and 9A-9F) during assembly of the twist pin 50 into its final position within the module 64 (FIGS. 4 and 9F).

Figure 9A:
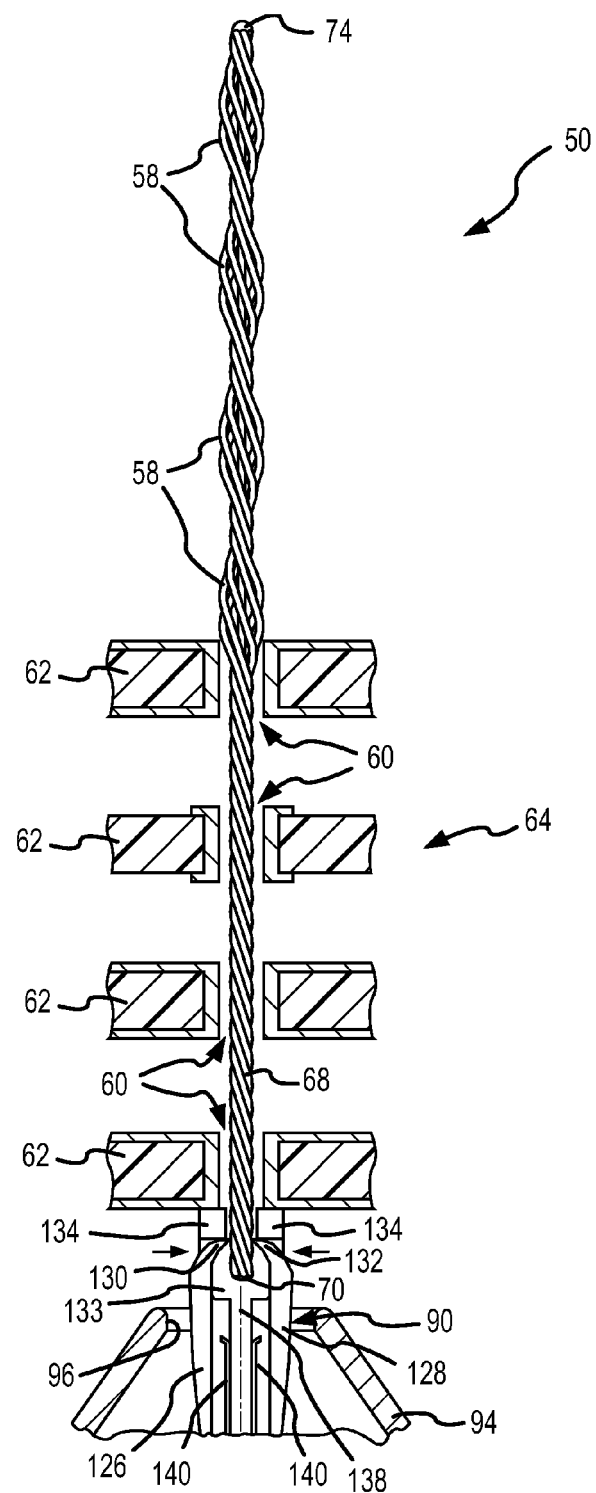
FIGS. 9A, 9B, 9C, 9D, 9E and 9F are partial, elevational and cross-sectional views of a portion of a pinch and cut blade of the gripping and cutting subassembly of the tool shown in FIGS. 6 and 7 and of the twist pin and module shown in FIG. 8, illustrating a sequence of basic operations performed in moving the twist pin from the initial position shown in FIG. 8 to the final assembled position within the module shown in FIG. 4.
Figure 9B:
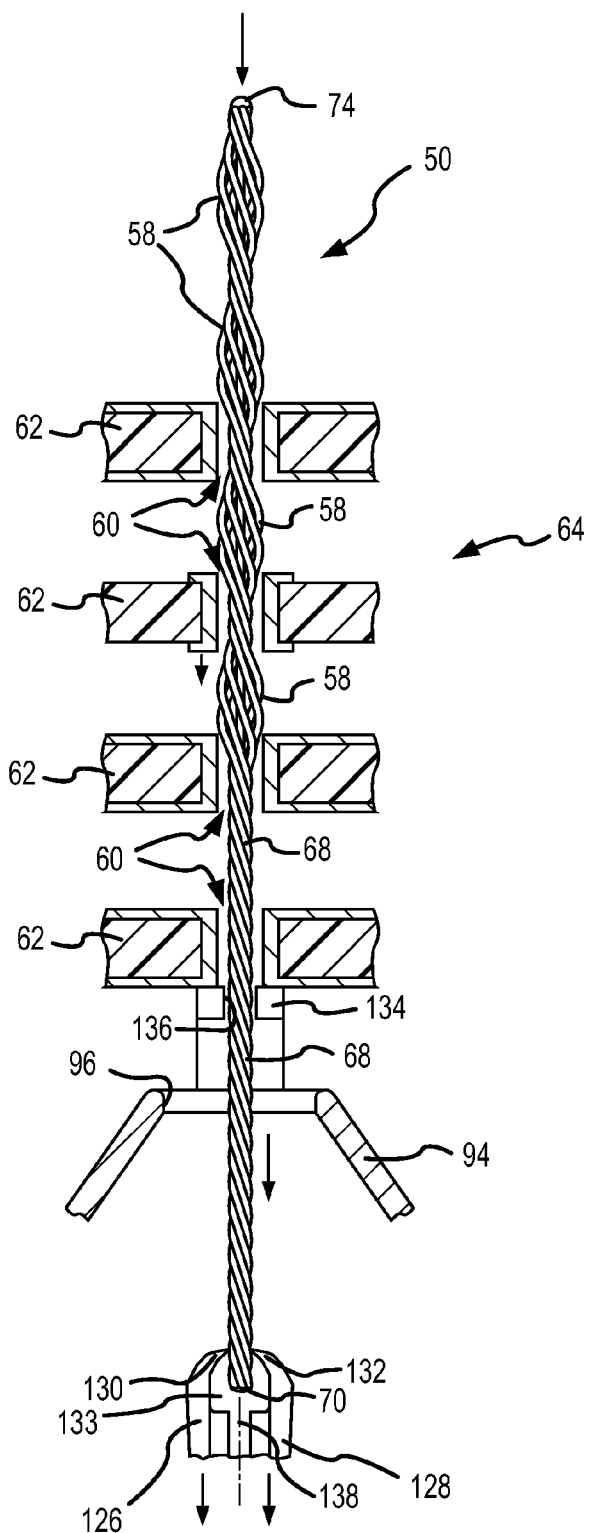
Figure 9C:
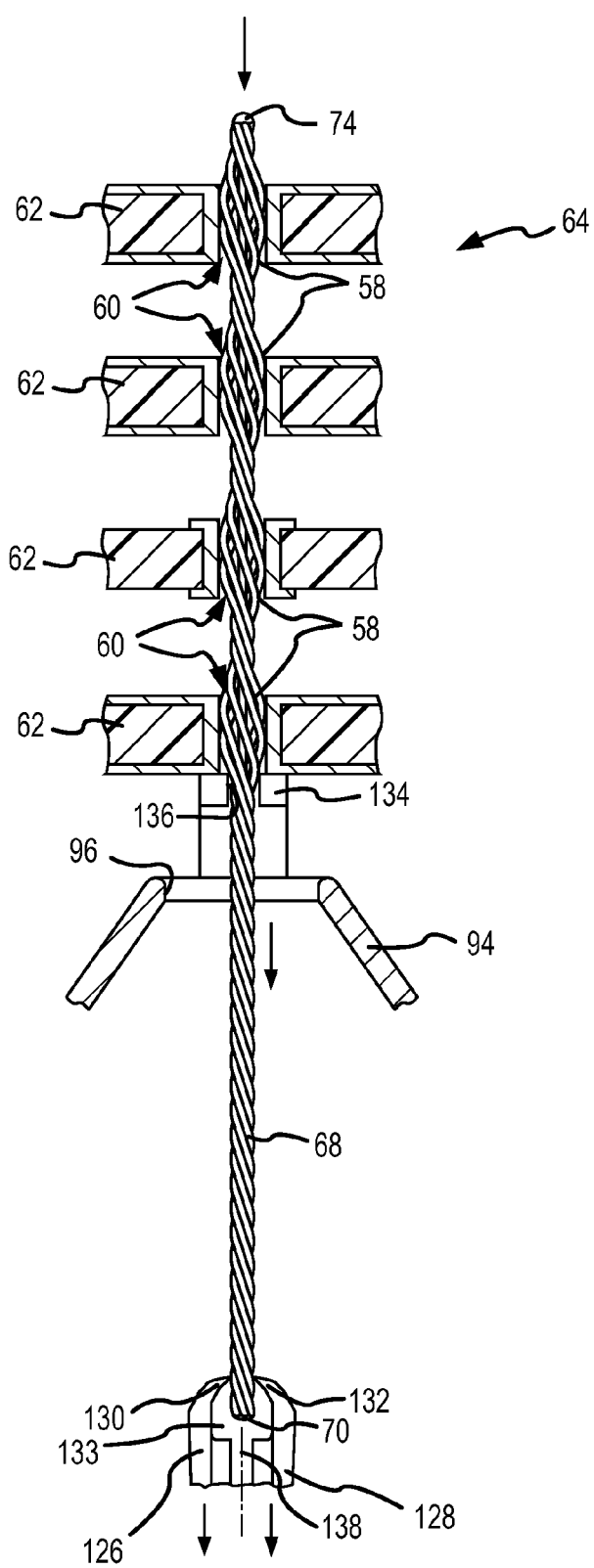
Figure 9D:
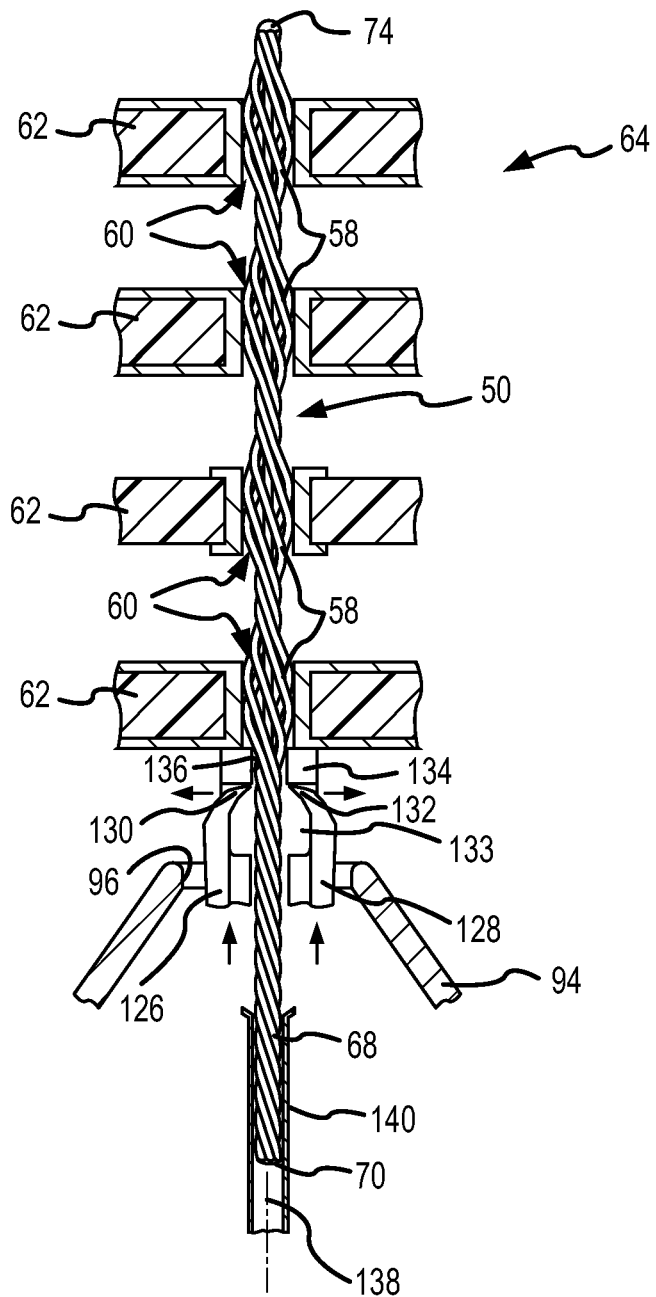
Figure 9E:
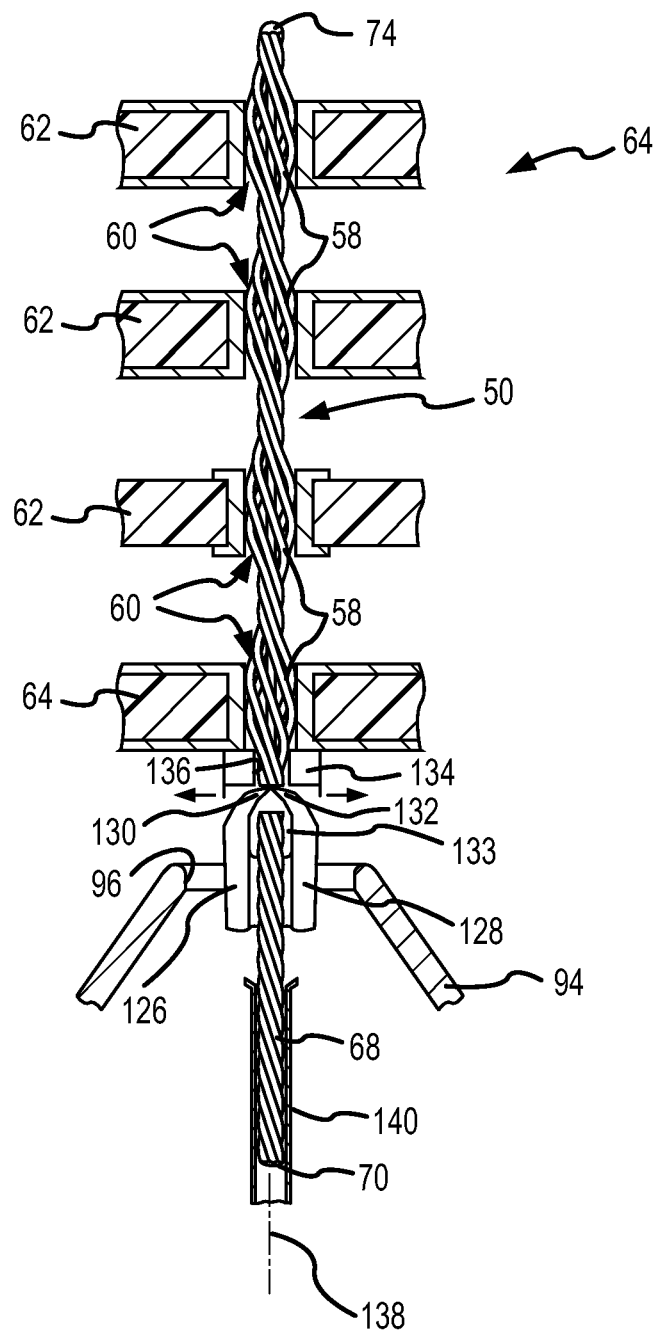
Figure 9F:
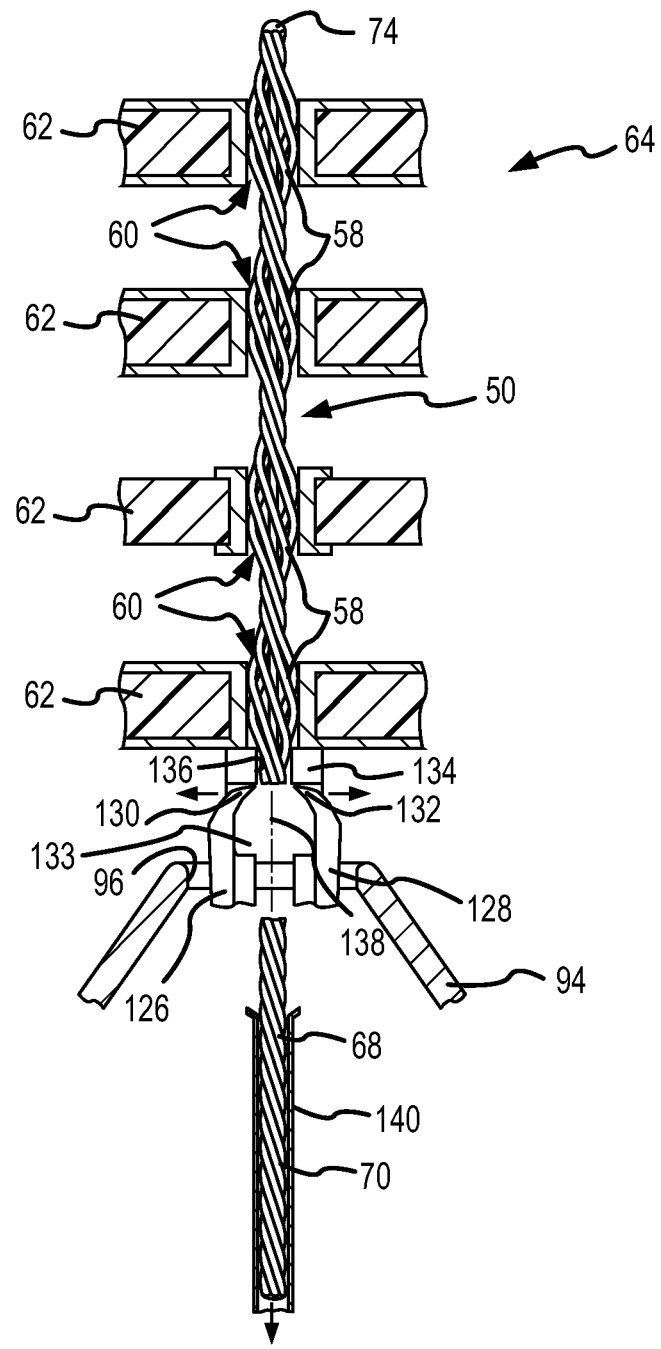
Figure 10:
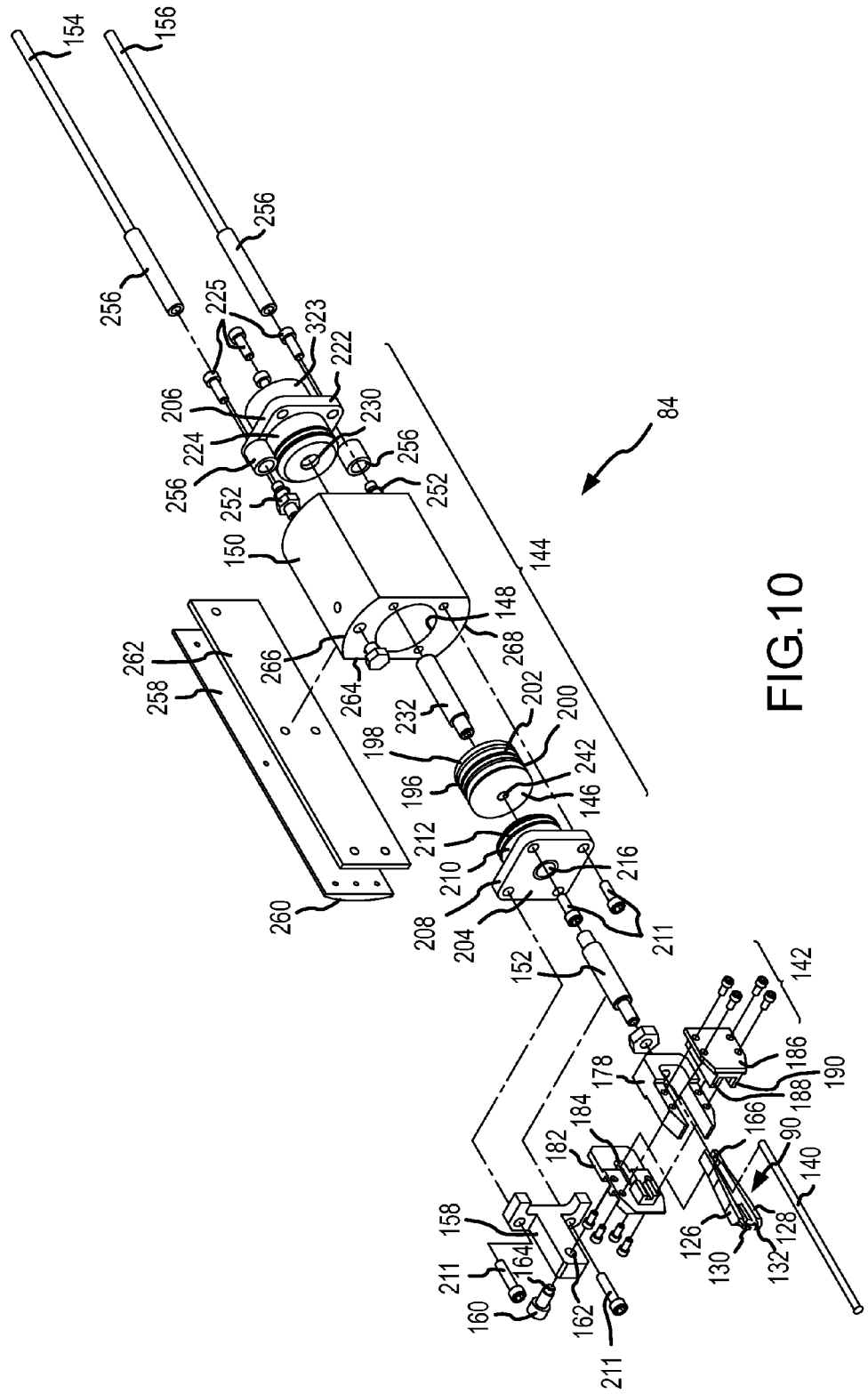
FIG. 10 is an exploded perspective view of the gripping and cutting subassembly of the tool shown in FIG. 7.

The longitudinal movement subassembly 86 connects to the gripping and cutting subassembly 84 within the housing 82 and moves the gripping and cutting subassembly 84, and its connected pinch and cut blade 90, in a longitudinal or axial manner within the forward shell 92, during the sequence of operations (FIGS. 9A-9F) involved in assembling the twist pin 50 (FIG. 1) into its final position (FIGS. 4 and 9F). The longitudinal movement subassembly 86 is generally located in the middle of the tool 80. An exterior surface of a longitudinal actuator 98 of the longitudinal movement subassembly 86 forms an intermediate portion of the housing 82.

The gripping and cutting subassembly 84 and the longitudinal movement subassembly 86 execute movements in response to the controlled application of pressurized compressed air to those subassemblies to pull the twist pin 50 (FIG. 1) into a final assembled position within the module 64 (FIGS. 4 and 9F). After the twist pin 50 has been pulled into its final assembled position within the module 64, the excess of the leader 68 of the twist pin 50 is severed from the remaining portion of the twist pin assembled into the module (FIG. 9E). In addition, the severed portion of the leader 68 is removed from the gripping and cutting subassembly 84 and the longitudinal movement subassembly 86 (FIG. 9F) by the application of vacuum from the interface and collection subassembly 88, and the severed leader is collected in a collection cup 99 of the interface and collection subassembly 88. By removing and collecting the severed leaders 68 in this manner, they do not interfere with the rapid, continuous and sequential operation of the tool 80.

The interface and collection subassembly 88 connects the pressurized air to the tool 80 to operate the gripping and cutting subassembly 84 and the longitudinal movement subassembly 86. The interface and collection subassembly 88 also connects the relatively lower pressure air or vacuum to the tool 80 for transporting the severed leader away from the gripping and cutting and longitudinal movement subassemblies 84 and 86. The interface and collection subassembly 88 is located within a rear shell 100 which is attached to the longitudinal actuator 98. A rear shell cap 102 connects to the rear shell 100. Hoses 104, 106, 108, and 110 extend through the rear shell cap 102 to supply pressurized air to the gripping and cutting subassembly 84 and the longitudinal movement subassembly 86. The hose 112 connects to a fitting on the rear shell cap 102 to supply the vacuum to the tool for removing the severed leader and for purging the vacuum in the collection cup 99 by the application of pressurized air.

Figure 24:
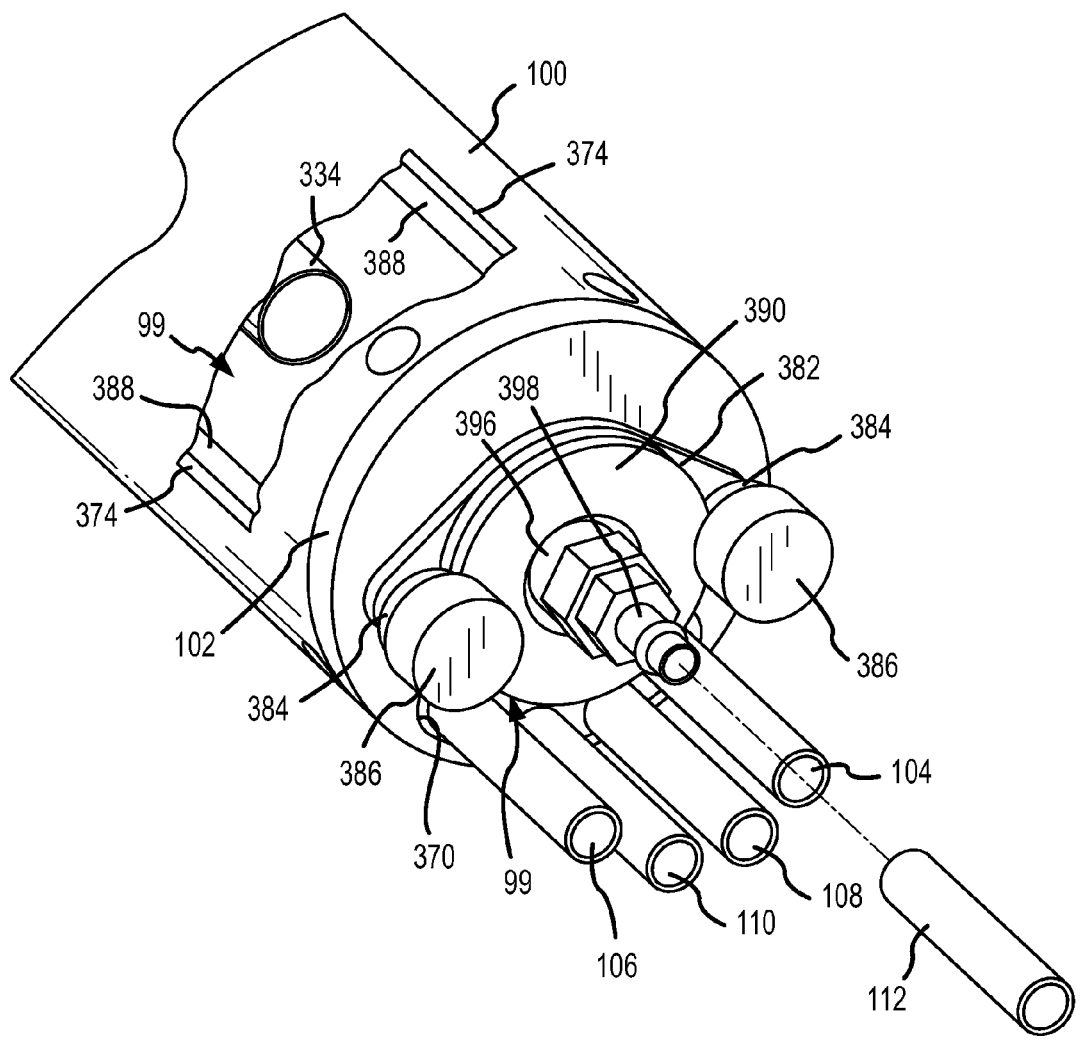
FIG. 24 is a partial perspective view of a rear end of the tool shown in FIGS. 6 and 7, illustrating the passage of pneumatic tubes through a rear cap of the pneumatic interface and leader collection subassembly shown in FIGS. 21-23.

A pneumatic and electrical control system 114 creates the sources of pressurized air and sub-ambient pressure or vacuum, and connects those pneumatic sources through the hoses 104-112, as shown in FIG. 6. The control system 114 responds to control signals 116 and 118 created by an operator closing foot switches 120 and 122, respectively, to apply the pressurized air and vacuum to the tool 80. The control signals 116 and 118 are received by a controller 124 (FIG. 24) of the control system 114. The controller 124 executes a program flow (FIG. 26) to deliver the pressurized air and vacuum through the hoses 104-112 to assure the operation of the tool 80 in response to the operator stepping on or activating the foot switches 120 and 122 at different points during the sequence of operations involved in assembling the twist pin 50 into the module 64.

Figure 8:
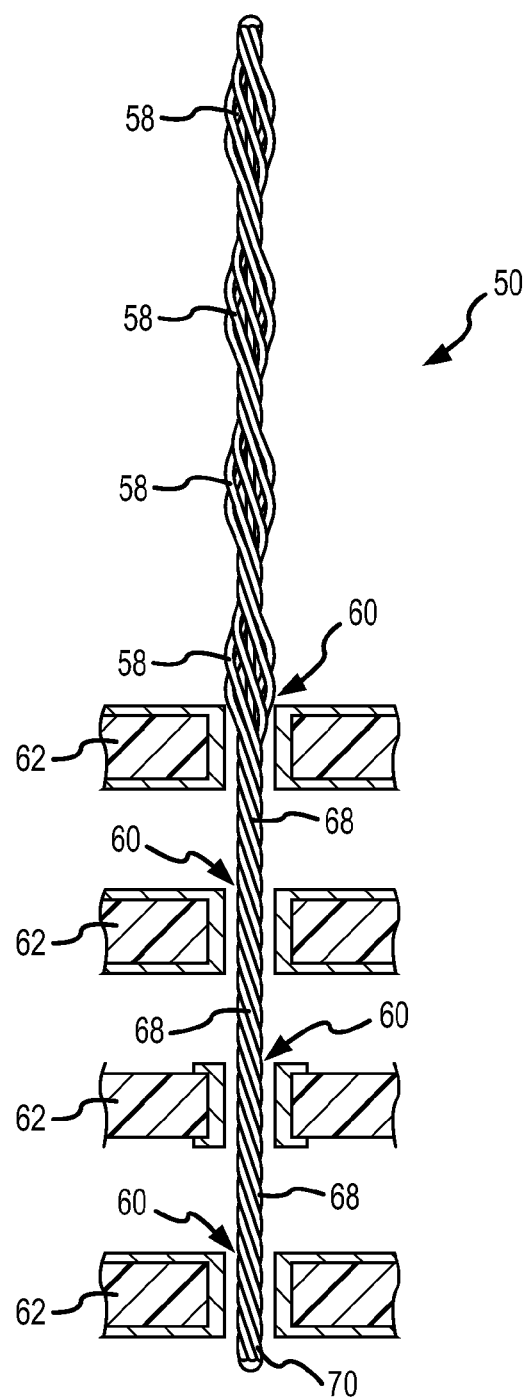
FIG. 8 is a side elevational view of the twist pin shown in FIG. 1 with its leader inserted through the vertically aligned vias of the printed circuit boards of the module shown in FIG. 4, prior to positioning the twist pin in the final assembled position shown in FIG. 4.

The basic operation of the tool 80 in assembling the twist pin 50 in the module 64 is illustrated in FIGS. 9A-9F. Use of the tool 80 commences after the leader 68 of the twist pin 50 has been inserted through a column of aligned vias 60 in the circuit boards 62 of the module 64, as shown in FIG. 8. The leader 68 is of sufficient length to position its terminal end 70 below and beyond the lowermost circuit board 62. The extension of the terminal end 70 of the leader 68 beyond the lowermost circuit board 62 permits it to be gripped by the pinch and cut blade 90, as shown in FIG. 9A.

The pinch and cut blade 90 includes two flexible jaw members 126 and 128 which move toward and away from one another as a result of movement imparted to the blade 90 by the gripping and cutting subassembly 84 (FIG. 7). The forwardmost terminal ends of the jaw members 126 and 128 each include sharp cutting wedges 130 and 132, respectively. The cutting wedges 130 and 132 face one another across an open space 133 between the jaw members 126 and 128. As shown in FIG. 9A, the jaw members 126 and 128 have moved together sufficiently in a partially closed position to pinch the cutting wedges 130 and 132 into the sides of the leader 68 at its terminal end 70. The cutting wedges 130 and 132 pinch into the sides of the leader 68 to a sufficient amount to firmly grip the leader 68 without severing it, so that the twist pin 50 can be pulled. The user positions the tool 80 and the cutting wedges 130 and 132 adjacent to the lowermost circuit board 62 by the use of a guide member 134, before the jaw members 126 and 128 are moved toward one another to pinch the cutting wedges 130 and 132 into the sides of the leader 68.

Next, as shown in FIG. 9B, the pinch and cut blade 90 is moved downward relative to the circuit boards 62 of the module 64, while the jaw members 126 and 128 maintain the cutting wedges 130 and 132 pinched into the sides of the leader 68. As the blade 90 moves downward, the housing 82 of the tool 80 remains stationary relative to the lowermost circuit board 62 due to contacting position of the guide member 134 against the lower circuit board. The guide member 134 is connected to the front end cap 94 (also see FIGS. 6 and 7) and serves as a spacer to assure that the twist pin 50 is pulled downward the correct amount to position the bulges 58 within each of the vias 60 of the circuit boards 62 in the final assembled position (FIG. 4). The guide member 134 includes a notch 136 which contacts the side of the leader 68 and aligns the tool 80 with the leader 68 extending along a center axis 138 of the tool 80. As the downward movement of the blade 90 pulls the twist pin 50 downward through the circuit boards 62, the leader 68 slides along the notch 136 in the guide member 134. The bulges 58 move into and out of the vias 60 until the twist pin achieves its final assembled position.

As shown in FIG. 9C, the blade 90 has pulled the twist pin 50 downward to its predetermined final assembled position where the bulges 58 are located within the vias 60 of the circuit board 62 of the module 64. The extent of downward movement represented in FIG. 9C is established by the amount of longitudinal movement of the longitudinal movement subassembly 86 (FIG. 7) in relation to the guide member 134 contacting the lowermost circuit board 62. With the twist pin 50 pulled into place, the jaw members 126 and 128 move apart to an open position to release the leader 68. The bulges 58 resiliently press against the sidewalls 66 of the vias 60 to hold the twist pin 50 in place in the final assembled position.

Next, as shown in FIG. 9D, the pinch and cut blade 90 is moved to an upper cutting position, at which the cutting wedges 130 and 132 are slightly spaced below the lowermost circuit board 62. In order to accomplish the movement represented by FIG. 9D, the jaw members 126 and 128 have been moved to separate transversely from the position shown in FIG. 9C and the cutting wedges 130 and 132 are spaced laterally away from the outside surface of the leader 68. In this open position, the jaw members 126 and 128 and the cutting wedges 130 and 132 do not interfere with the upward movement of the pinch and cut blade 90 from the position shown in FIG. 9C to the position shown in FIG. 9D. The open position of the jaw members 126 and 128 allows the leader 68 to pass between the cutting wedges 130 and 132. The guide member 134 keeps the tool 80 positioned with the leader 68 along the center axis 138 while the blade 90 is moved upward. This ensures that the leader 68 enters a conduction tube 140 which is positioned concentrically about the central axis 138 so that the leader 68 can be cleanly severed and transported away from the gripping and pulling subassembly 84 to avoid interfering with the action of the tool 80 in the next subsequent operation of positioning and severing another twist pin 50.

The excess portion of the leader 68 is next severed by lateral inward movement of the jaw members 126 and 128 to the fully closed position, as shown in FIG. 9E. The cutting wedges 130 and 132 move together and sever the leader 68 from the portion of the twist pin 50 which remains in the final assembled position within the module 64. Movement of the gripping and cutting subassembly 84 causes the jaw members 126 and 128 to move toward one another and force the cutting wedges 130 and 132 completely through the leader 68, thereby severing the external portion of the leader.

Finally, as shown in FIG. 9F, the severed portion of the leader 68 is transported away by the application of vacuum within the conduction tube 140. The vacuum transports the severed portion of the leader away from the gripping and cutting subassembly 84 and the longitudinal movement subassembly 86, where the severed leader 68 is collected within the hollow interior of the collection cup 99 (FIG. 7) of the interface and collection subassembly 88. Simultaneously with removing the severed portion of the leader 68, the jaw members 126 and 128 are moved away from one another to the open position to ready the jaw members for executing the next subsequent operation in which a twist pin is pulled into the final assembled position and the severed leader is removed.

As can be appreciated from this overview description, the pulling and cutting tool 80 is conveniently handled and maneuvered by manual manipulation. The manual manipulation allows each twist pin to be assembled in the final position without the necessity to use relatively complex stationary equipment. Moreover, all of the assembly operations, i.e. gripping the twist pin, pulling the twist pin into the final position, severing the leader from the remaining assembled portion of the twist pin, and removing the severed twist pin, are achieved in a rapid continuous sequence. Operating in this manner, the tool 80 is capable of rapidly and sequentially inserting twist pins to efficiently assemble the module 64. These same advantageous features are also available if the tool 80 is incorporated in stationary equipment, such as that which would be typically used in an assembly line operation.

More details concerning the gripping and cutting subassembly 84, the longitudinal movement subassembly 86, and the pneumatic interface and severed leader collection subassembly 88 of the tool 80, and of the pneumatic and electric control system 114, are described below.

Gripping and Cutting Subassembly

The gripping and cutting subassembly 84 is shown in FIGS. 7 and 10-15. The principal function of the gripping and cutting subassembly 84 is to move the pinch and cut blade 90 so that it grips the leader 68 by pinching it so that the leader 68 can be pulled (FIGS. 9A, 9B and 9C), and thereafter severing the leader 68 (FIG. 9E). To accomplish these operations, the gripping and cutting subassembly 84 includes the pinch and cut blade 90, a blade deflecting mechanism 142 which interacts with the pinch and cut blade 90 to move the jaw members 126 and 128 and cutting wedges 130 and 132 toward and away from one another, and a blade activator 144 which moves the blade deflecting mechanism 142 relative to the pinch and cut blade 90 to cause the jaw members 126 and 128 to move toward and away from one another.

The blade activator 144 is preferably of a conventional piston and cylinder construction, in which a piston 146 moves longitudinally within a cylinder 148 (FIGS. 10, 14 and 15) of a cylinder body 150 of the blade activator 144. A deflector connection rod 152 is connected at a rear end to the piston 146, and a front end of the connection rod 152 is connected to the blade deflecting mechanism 142. The connections are preferably threaded connections. Pressurized air is delivered through tubes 154 and 156 to the blade activator 144 to move the piston 146 longitudinally forward and backward within the cylinder 148. The movement of the piston 146 is transferred through the deflector connection rod 152 to the blade deflecting mechanism 142. The pinch and cut blade 90 is positioned stationarily, and the forward and backward movement of the blade deflecting mechanism 142 relative to the blade 90 moves the jaw members 126 and 128 into and between the opened, closed and partially closed positions shown in FIGS. 9D, 9E and 9A, respectively.

Figure 11:
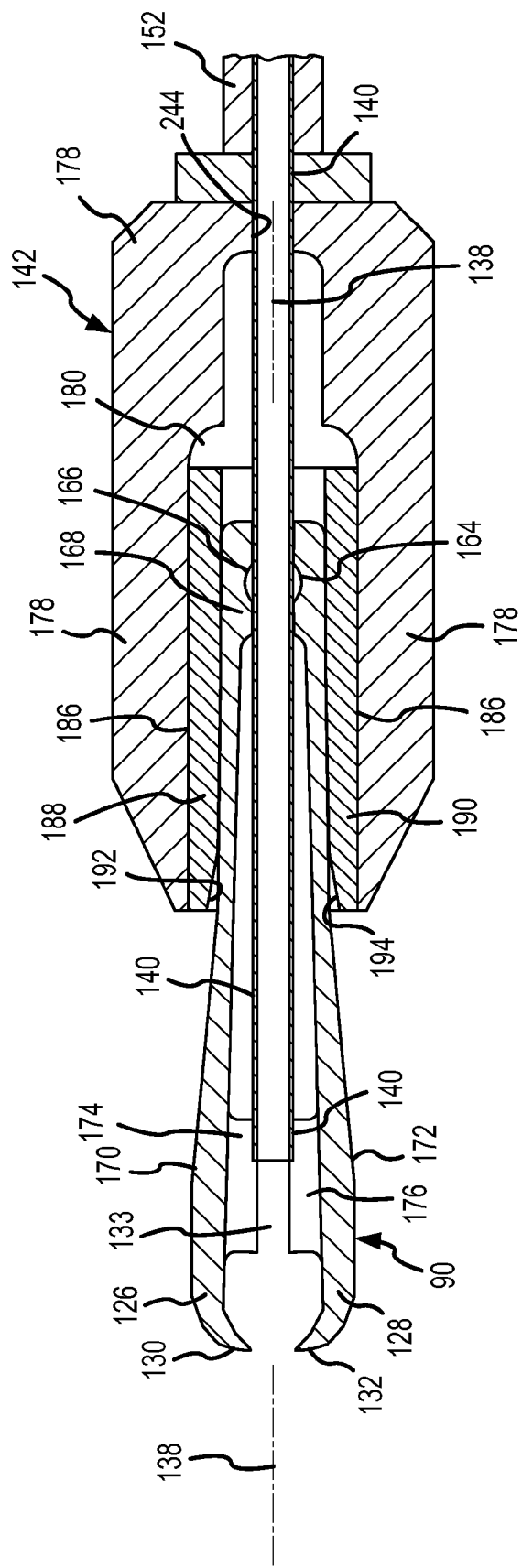
FIG. 11 is an enlarged vertical and longitudinal cross sectional view of a forward portion of a pinch and cut blade and a blade deflecting mechanism of the gripping and cutting subassembly shown in FIGS. 7 and 10, taken substantially in the plane of line 11-11 in FIG. 7, showing the pinch and cut blade positioned in a forward position relative to the blade deflecting mechanism, resulting in the pinch and cut blade assuming the position shown in FIGS. 9D and 9F.
Figure 12:
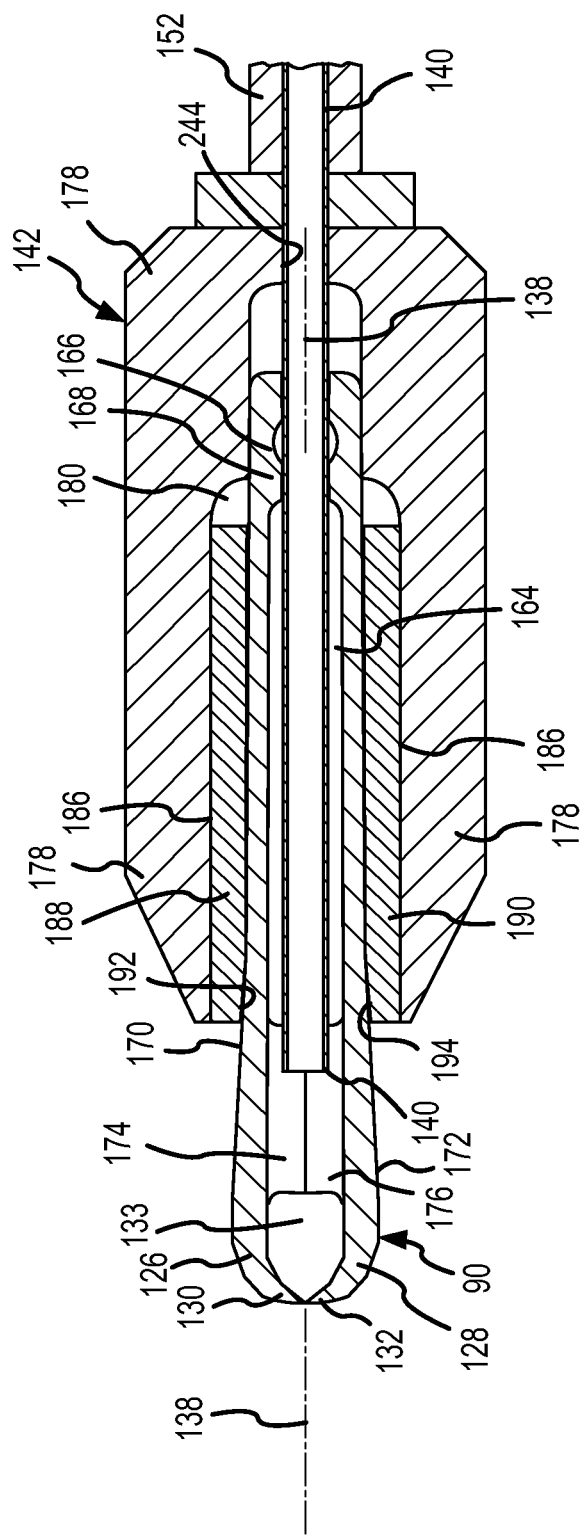
FIG. 12 is a cross sectional view similar to the view of FIG. 11, with the pinch and cut blade positioned in a rearward position relative to the blade deflecting mechanism, resulting in the pinch and cut blade assuming the position shown in FIG. 9E.
Figure 13:
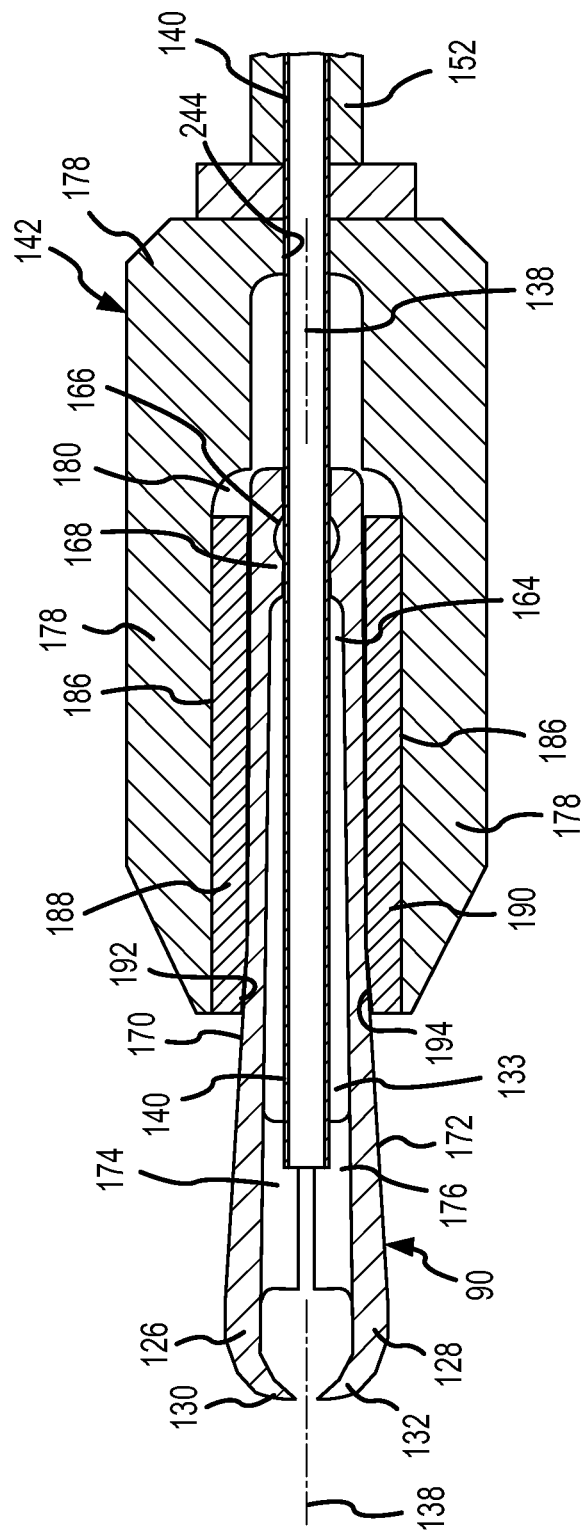
FIG. 13 is a cross sectional view similar to the views of FIGS. 11 and 12, with the pinch and cut blade positioned relative to the blade deflecting mechanism in an intermediate position compared to those positions shown in FIGS. 11 and 12, resulting in the pinch and cut blade assuming the position shown in FIGS. 9A, 9B, and 9C.

A blade support bracket 158 connects to and extends longitudinally forward from the cylinder body 150. A retainer pin 160 extends though a hole 162 in a front end of the support bracket 158. A reduced-diameter portion 164 of the pin 160 extends beyond the support bracket 158 and fits into a hole 166 in a rear end web portion 168 of the blade 90 (FIGS. 11-13). In this manner, the blade 90 is connected to a forward end of the blade support bracket 158, thereby holding the blade 90 in a stationary longitudinal position relative to the blade activator 144. However, the pin 160 permits the blade 90 to pivot in a plane perpendicular to an axis through the pin 160.

Figure 14:
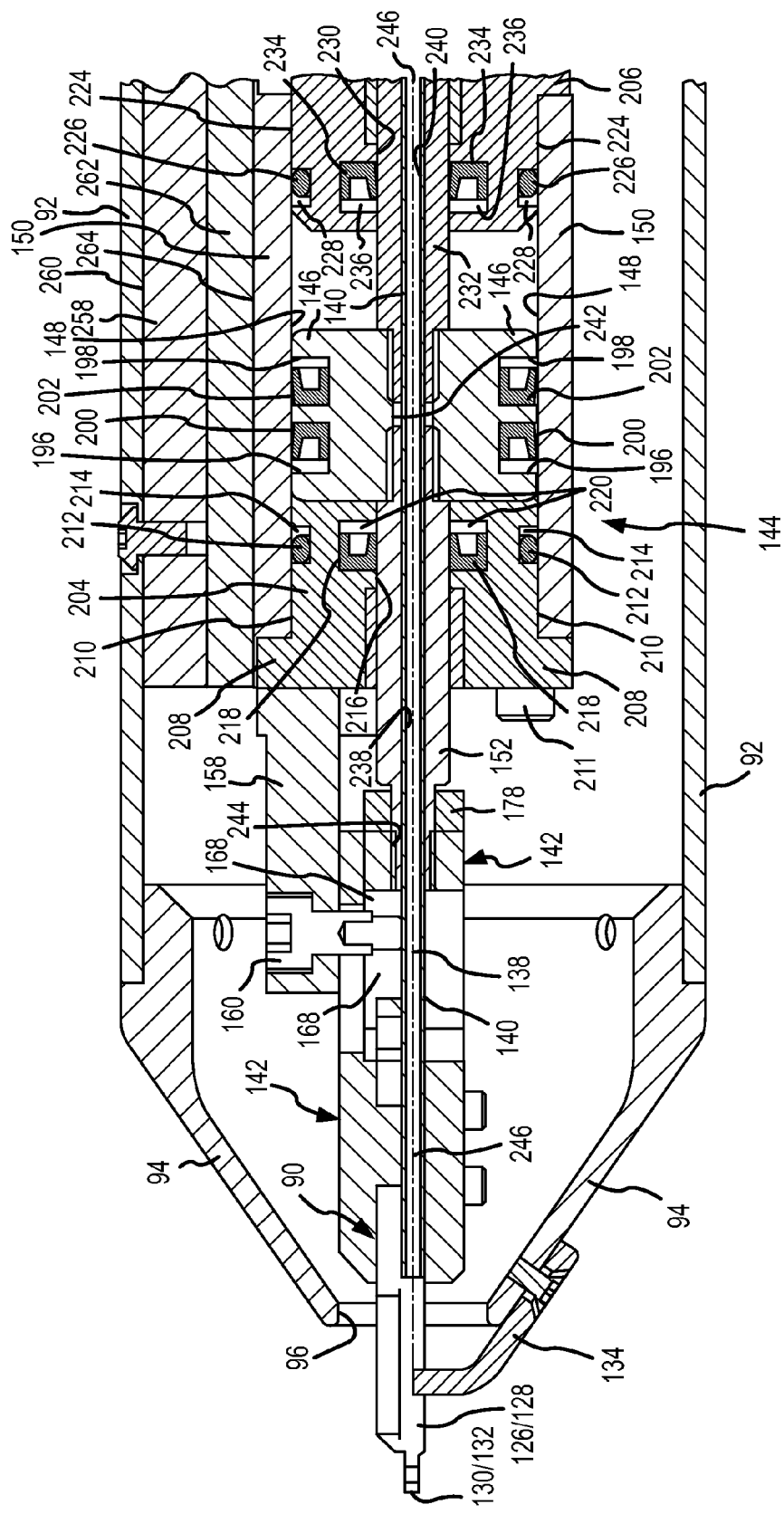
FIG. 14 is an enlarged horizontal and longitudinal cross sectional view of a forward portion of the gripping and cutting subassembly of the tool shown in FIG. 7, taken substantially in the plane of line 14-14 in FIG. 7, illustrating certain aspects of the gripping and cutting subassembly.

More details of the pinch and cut blade 90 are shown in FIGS. 11-13. The pinch and cut blade 90 is formed as an integral single-piece structure, preferably of resilient spring steel. The web portion 168 joins the jaw members 126 and 128 at a rear end of the blade 90. The hole 166 which receives the retainer pin 160 extends through the web portion 168. When positioned within the gripping and cutting subassembly 84, the jaw members 126 and 128 are generally symmetrically positioned on opposite sides of the center axis 138. The jaw members 126 and 128 extend longitudinally forwardly and transversely outwardly from the web portion 168. The jaw members 126 and 128 are separate from one another except where they integrally join the blade 90 at the web portion 168. The web portion 168 is transversely offset from the center axis of the tool 80 to avoid contacting the conduction tube 140 which extends along the center axis 138 (FIG. 14).

Exterior surfaces 170 and 172 of the jaw members 126 and 128, respectively, are smooth and generally symmetrical with respect to a center line through the blade 90 which is coincident the center axis 138. The exterior surfaces 170 and 172 are contacted by the blade deflecting mechanism 142 to cause the jaw members 126 and 128 to deflect toward one another. The strength and resiliency of the material from which the blade 90 is made causes the jaw members 126 and 128 to rebound back away one another when the force from the blade deflecting mechanism 142 is removed.

Shoulders 174 and 176 extend integrally from the inside surfaces of the jaw members 126 and 128, respectively, along a substantial portion of the length of each jaw member 126 and 128. The shoulders 174 and 176 extend toward one another across the open space 133 between the jaw members 126 and 128. The shoulders 174 and 176 reinforce each of the jaw members 126 and 128 to prevent them from bending substantially when the blade deflecting mechanism 142 contacts and interacts with the exterior surfaces 170 and 172. Like the web portion 168, the shoulders 174 and 176 are also transversely displaced from the center axis 138 to avoid interfering with the leader 68 or the conduction tube 140, when the jaw members 126 and 128 are closed as understood from FIG. 14.

The forward ends of the jaw members 126 and 128 curve longitudinally forward and transversely inward toward one another and terminate at the cutting wedges 130 and 132. The cutting wedges 130 and 132 are made of hardened sharpened material. The material of the jaw members 126 and 128 also exhibit sufficient strength so that a transverse inward force applied by the blade deflecting mechanism 142 to force the jaw members 126 and 128 toward one another also brings the cutting wedges 130 and 132 toward one another, when severing the leader 68 or when pinching the leader 68 without severing it, as shown in FIGS. 9E and 9A, respectively.

More details of the blade deflecting mechanism 142 are shown in FIGS. 10-14. The blade deflecting mechanism 142 includes a clevis 178 which is connected at a center point to the forward end of the connection rod 152. The U-shaped body which defines the clevis 178 projects forward away from the connection rod 152, and defines an open space 180 in the center of the clevis 178. The pinch and cut blade 90 is positioned within the open space 180. A bearing plate 182 is connected to the clevis 178 on one transverse side of the open space 180. An elongated slot 184 is formed in the bearing plate 182 to receive the retainer pin 160. The elongated slot 184 permits the bearing plate 182 and the clevis 178 to move forward and backward with respect to the stationary retainer pin 160 as the blade deflecting mechanism 142 moves forward and backward. A wedge plate 186 is connected to the clevis 178 on the opposite transverse side of the open space 180 from the bearing plate 182. The bearing plate 182 and the wedge plate 186 support and retain the pinch and cut blade 90 between their opposing facing surfaces within the open space 180, and provide bearing surfaces along which the blade 90 slides when the blade deflecting mechanism 142 moves forward and backward.

The wedge plate 186 includes a pair of ridges 188 and 190 which project into the open space 180 from the wedge plate 184. Cam surfaces 192 and 194 are formed on the ridges 188 and 190, respectively, and the cam surfaces 192 and 194 face one another in that portion of the space 180 between the ridges 188 and 190. The jaw members 126 and 128 of the blade 90 fit in the space between the ridges 188 and 190. The cam surfaces 192 and 194 contact the exterior surfaces 170 and 172 of the jaw members 126 and 128, respectively. The cam surfaces 192 and 194 extend forwardly and transversely outward in a similar manner to the forward and transversely outward extension of the exterior surfaces 170 and 172. The cam surfaces 192 and 194 are also symmetrical about the center line 138.

Forward longitudinal movement of the clevis 178 and the attached wedge plate 186 forces the ridges 188 and 190 with their cam surfaces 192 and 194 to slide forward along the exterior surfaces 170 and 172 of the jaw members 126 and 128, respectively. The fixed distance between the cam surfaces 192 and 194 forces the jaw members 126 and 128 to deflect more closely together, as the cam surfaces 190 and 192 move forward along the exterior surfaces 170 and 172. In a similar manner, rearward longitudinal movement of the clevis 178 slides the cam surfaces 192 and 194 rearwardly with respect to the exterior surfaces 170 and 172, allowing the resiliency of the material from which the blade 90 is formed to move the jaw members 126 and 128 outwardly away from one another. With the blade deflecting mechanism 142 moved to its most rearward position, a slight clearance exists between the cam surfaces 192 and 194 and the exterior surfaces 170 and 172, allowing the jaw members 126 and 128 to separate fully in the open position.

More details concerning the blade activator 144 are shown in FIGS. 10-15. The cylinder body 150 defines the cylinder 148 along which the piston 146 moves. The cylinder 148 extends from a front end of the cylinder body 150 to a rear end of the body 150. The piston 146 has an exterior diameter that allows it to fit within the cylinder 148. Longitudinally spaced annular grooves 196 and 198 circumscribe the piston 146. The grooves 196 and 198 receive sealing rings 200 and 202 which hermetically seal the piston 146 within the cylinder 148. A front cylinder cap 204 is attached to the front end of the cylinder body 150, and a rear cylinder cap 206 is attached to the rear end of the cylinder body 150. The piston 146 moves within the cylinder 148 between the front and rear cylinder caps 204 and 206.

The front cylinder cap 204 has a generally square connection flange 208 with a rearward extending cylindrical projection 210. The connection flange 208 is attached to front end of the cylinder body 150 with screws 211. The cylindrical projection 210 has an exterior diameter that is slightly smaller than the interior diameter of the cylinder 148. With the flange 208 attached to the cylinder body 150, the cylindrical projection 210 extends rearwardly into the cylinder 148 from the front end of the cylinder body 150. A sealing ring 212 fits within an annular recess 214 formed in the exterior of the cylindrical projection 210, and the sealing ring 212 establishes a hermetic seal between the front cap 204 and the cylinder body 150 within the cylinder 148.

The front cylinder cap 204 has a front bore 216 through which the connecting rod 152 extends. A front rod seal 218 is positioned within an annular groove 220 in the front bore 216 and contacts the exterior surface of the connecting rod 152. The front rod seal 218 establishes a hermetic seal around the connecting rod 152 where it exits from the front cylinder cap 204. A rear end of the connecting rod 152 connects to the piston 146 within the cylinder 148. In this manner, longitudinal forward and backward movement of the piston 146 within the cylinder 148 is transferred through the connecting rod 152 to the blade deflecting mechanism 142.

The rear cylinder cap 206 is a somewhat similar construction to the front cylinder cap 204. The rear cylinder cap 206 has a generally square connection flange 222 with a forward extending cylindrical projection 224. The connection flange 222 is attached to rear end of the cylinder body 150 with screws 225. The cylindrical projection 224 has an exterior diameter that is slightly smaller than the interior diameter of the cylinder 148. With the flange 222 attached to the cylinder body 150, the cylindrical projection 224 extends forwardly into the cylinder 148 from the rear end of the cylinder body 150. A sealing ring 226 fits within an annular recess 228 formed in the exterior of the cylindrical projection 224, and a sealing ring 226 establishes a hermetic seal between the rear cap 206 and the cylinder body 150 within the cylinder 148.

Figure 16:
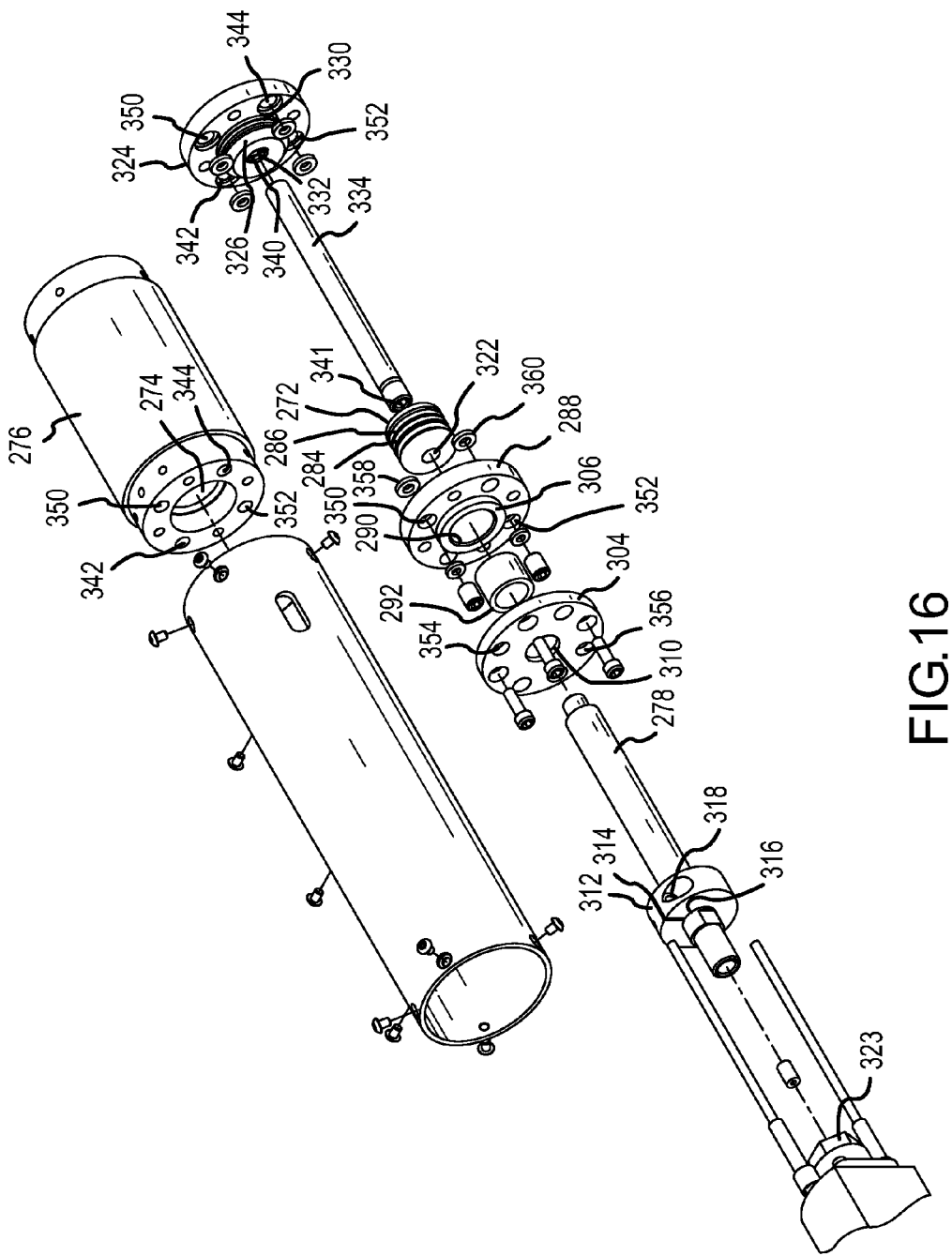
FIG. 16 is an exploded perspective view of the longitudinal movement subassembly of the tool shown in FIG. 7.

The rear cylinder cap 206 has a rear bore 230 through which a rod extension 232 extends. A rear rod seal 234 is positioned within an annular groove 236 in the rear bore 230 and contacts the exterior surface of the rod extension 232. The rear rod seal 230 establishes a hermetic seal around the rod extension 232, where the rod extension 232 exits from the rear cylinder cap 206. A front end of the rod extension 232 connects by threads to the rear side of the piston 146 within the cylinder 148. In this manner, the rod extension 232 moves longitudinally forward and backward with the corresponding movement of the piston 146 within the cylinder 148. The rear end of the rod extension 232 extends rearwardly from the rear cap 206, is centered generally about the center axis 138 and extends to the longitudinal movement subassembly 86 (FIGS. 7 and 16).

Figure 15:
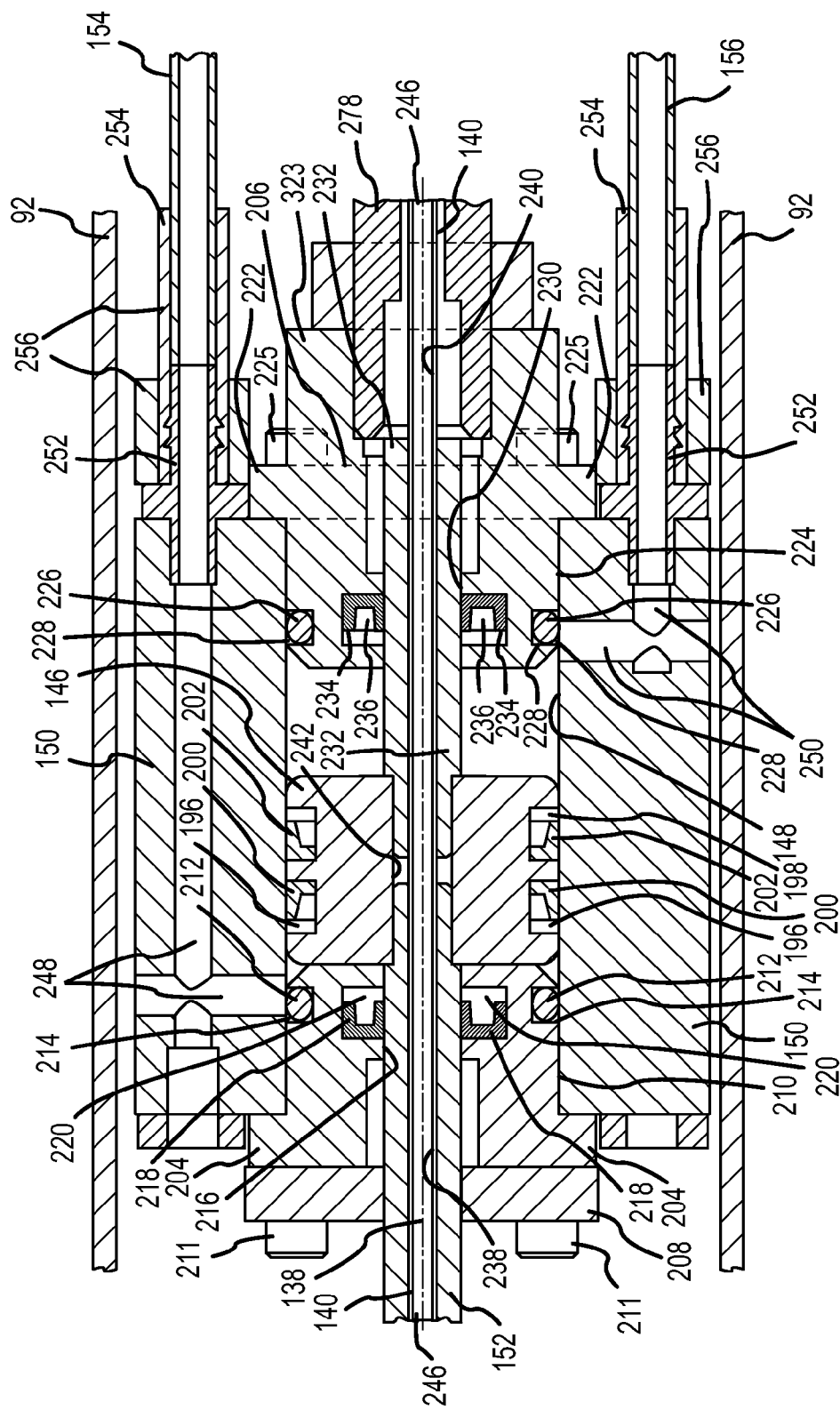
FIG. 15 is an enlarged vertical and longitudinal cross sectional view of a blade activator portion of the gripping and cutting subassembly of the tool shown in FIG. 7, taken substantially in the plane of line 15-15 in FIG. 7.

As shown in FIGS. 14 and 15, the connecting rod 152 and the rod extension 232 are hollow, and thereby define interior passageways 238 and 240 through the rod 152 and the rod extension 232, respectively. A central hole 242 is formed through the piston 146 in alignment with the interior passageways 238 and 240 of the connecting rod 152 and the rod extension 232. As shown in FIGS. 11-13, the clevis 178 has a hole 244 formed through it in alignment with the interior passageway 238 of the connecting rod 152. In this manner, an unobstructed internal passageway 246 extends through the hole 244 in the clevis, the interior passageway 238 of the connecting rod 152, the central hole 242 of the piston 146, and the interior passageway 240 of the rod extension 232. The passageways 238 and 240 and the holes 242 and 244 are generally coaxial about the central axis 138.

The conduction tube 140 is located within the interior passageway 246 defined by the passageways 238 and 240 and the holes 242 and 244. The conduction tube 140 conducts the severed leaders 68 away from the cutting blade 90 of the gripping and cutting subassembly 84, as discussed in conjunction with FIG. 9F. A forward end of the conduction tube 140 is positioned longitudinally along the center axis 138 in the space 133 and between the jaw members 126 and 128. The forward end of the conduction tube 140 is also slightly flared to help direct the terminal end 70 of the leader 68 into the conduction tube 140, to ensure that the severed leader 68 enters and is transported through the conduction tube 140, as shown in FIG. 9F.

Fluid passageways 248 and 250 are formed forwardly from the rear end of the cylinder body 150, and the passageways 248 and 250 open into the cylinder 148 at positions which are at the front and rear sides of the piston 146, respectively, as shown in FIG. 15. The passageways 248 and 250 provide a hermetically sealed path through the cylinder body 150 and into the cylinder 148. Conventional hose fittings 252 are attached to the rear end of the cylinder body 150 at positions which surround the fluid passageways 248 and 250. The hose fittings 252 are positioned on the top and bottom of the flange 222 of the rear cylinder cap 206. A flexible connection sleeve 254 is attached to each forward end of the tubes 154 and 156. Each connection sleeve 254 is slipped over a hose fitting 252 in a conventional friction-fit connection. A retaining tubing clamp 256 slides over that portion of the connection sleeve 254 which surrounds the hose fitting 252, to firmly maintain the connection of each connection sleeve 254 to one hose fitting 252.

Compressed air is supplied through the tubes 154 and 156 and into the fluid passageways 248 and 250, respectively, to move the piston 146 longitudinally within the cylinder 148. Compressed air in the fluid passageway 250 enters the portion of the cylinder 148 between the piston 146 and the rear cylinder cap 206. The pressurized air admitted through the passageway 250 forces the piston 146 to move longitudinally forwardly within the cylinder 148. The longitudinal forward movement of the piston causes the blade deflecting mechanism 142 to move forward relative to the stationary pinch and cut blade 90, thereby pinching the jaw members 126 and 128 toward one another, to establish the closed or partially closed position of the jaw members (FIGS. 9E and 9A). Applying compressed air at a relatively higher pressure through the fluid passageway 250 creates a relatively greater forward longitudinal movement of the piston 146, resulting in greater deflecting force on the jaw members, which results in severing the leader 68 from the remaining portion of the twist pin 50 (FIG. 9E) as a result of moving the cutting wedges 130 and 132 into contact with one another, as the jaw members 126 and 128 move to the fully closed position. Applying compressed air at a relatively lower pressure through the fluid passageway 250 creates relatively lesser longitudinal movement of the piston 146, resulting in lesser deflecting force on the jaw members, which results in gripping the leader 68 (FIG. 9A) as a result of moving the cutting wedges 130 and 132 toward but not contacting one another, as the jaw members move into the partially closed position.

Compressed air supplied through the fluid passageway 248 enters the portion of the cylinder 148 between the piston 146 and the front cylinder cap 204. The pressurized air admitted through the passageway 248 forces the piston 146 to move longitudinally rearwardly within the cylinder 148. The longitudinal rearward movement of the piston 146 causes the blade deflecting mechanism 142 to move rearward relative to the stationary pinch and cut blade 90, thereby allowing the jaw members 126 and 128 to move away from one another and establish the open position of the jaw members (FIGS. 9D and 9F).

As has been discussed previously, the entire gripping and cutting subassembly 84 moves longitudinally within the interior of the front shell 92 and front end cap 94, as a result of longitudinal forward and backward movement applied by the longitudinal movement subassembly 86. The entire gripping and cutting subassembly 84 is restrained against rotation while it is moved longitudinally forward and backward within the front shell 92 by a non-rotating plate 258, shown in FIGS. 7, 10 and 14. The non-rotating plate 258 attaches to the interior sidewall of the front shell 92. An exterior cylindrically curved surface portion 260 of the non-rotational plate 258 conforms to the inside surface of the front shell 92. A generally planar and flat bearing plate 262 attaches to the non-rotational plate 258 and faces outward toward the center axis of the tool 80. The bearing plate 262 is preferably formed of a friction-reducing material such as plastic or Teflon. The cylinder body 150 includes a flat surface 264 which faces and contacts an adjoining flat surface of the bearing plate 262. The flat surface 264 of the cylinder body 150 slides along the flat bearing plate 262 when the gripping and cutting subassembly 84 is moved longitudinally.

Upper and lower surfaces 266 and 268 (FIG. 10) of the cylinder body 150 generally have the same cylindrical curvature as the inside surface of the front shell 92. The curved surfaces 266 and 268 are closely adjacent to the inside surface of the front shell 92. The close adjacency of the curved surfaces 266 and 268 with the inside surface of the front shell 92 maintains the flat surface 264 of the cylinder body 150 in contact the flat bearing plate 262, thereby preventing rotational movement of the cylinder body 150 and the attached blade deflecting mechanism 142 and pinch and cut blade 90 as the gripping and cutting assembly 84 moves longitudinally forward and backward.

Longitudinal Movement Subassembly

The longitudinal movement subassembly 86 shown in detail in FIGS. 7 and 16-20. The principal function of the longitudinal movement subassembly 86 is to move the gripping and cutting subassembly 84 longitudinally within the tool 80, thereby pulling the gripped twist pin 50 into the final desired position (FIGS. 9B and 9C) and returning the gripping and cutting subassembly 84 to a position where the pinch and cut blade 90 can sever the leader 68 at the desired location (FIG. 9D). To accomplish these operations, the longitudinal movement subassembly 86 includes a longitudinal activator 270. The longitudinal activator 270 is preferably of a conventional piston and cylinder construction, in which a piston 272 is moveably positioned within a cylinder 274 of a cylinder body 276. A longitudinal movement connection rod 278 is connected at its rear end to the piston 272, and a front end of the longitudinal movement rod 278 is connected to the blade activator 144. Longitudinal movement of the piston 272 within the cylinder 274 is transferred by the connection rod 278 to the blade activator 144, thereby longitudinally moving of the gripping and cutting subassembly 84. Compressed air for moving the piston 272 in the cylinder 274 is supplied to the longitudinal activator 270 through the pneumatic interface and leader collection subassembly 88.

More details concerning the longitudinal activator 270 are shown in FIGS. 16-20. The cylinder body 276 defines the cylinder 274 along which the piston 272 moves. The cylinder 274 extends from a front end of the cylinder body 276, which faces toward the gripping and cutting subassembly 84 (FIG. 7), to a rear end of the cylinder body 276, which faces toward the pneumatic interface and leader collection subassembly 88 (FIG. 7). The piston 272 has an exterior diameter that is slightly smaller than the interior diameter of cylinder 274, allowing the piston 272 to be positioned within the cylinder 274 and to slide longitudinally within the cylinder 274. Longitudinally spaced annular recesses 280 and 282 circumscribe the piston 272. The recesses 280 and 282 receive sealing rings 284 and 286 which hermetically seal the piston 272 within the cylinder 274.

A front cylinder cap 288 is attached to the front end of the cylinder body 276. A bore 290 extends through the front cylinder cap 288, and a bushing 292 is positioned within the bore 290. The bushing 292 fits around the longitudinal connection rod 278 to guide the connection rod 278 as it moves longitudinally forward and backward relative to the front cylinder cap 288. The bore 290 also includes an annular recess 294 within which an O-ring seal 296 is positioned. The O-ring seal 296 creates a hermetic seal at the bore 290 between the front cylinder cap 288 and the connection rod 278.

The front cylinder cap 288 also includes a rearward extending cylindrical projection 298. The cylindrical projection 298 has a slightly smaller outside diameter than the diameter of the cylinder 274, thereby allowing the cylindrical projection 298 to extend rearwardly into the forward end of the cylinder body 276. An annular shaped recess 300 extends circumferentially around the cylindrical projection 298, and holds a sealing ring 302. The sealing ring 302 creates a hermetic seal between the front cylinder cap 288 and the cylinder body 276.

A stop plate 304 is attached to the forward facing surface of the front cylinder cap 288. A cylindrical-shaped protrusion 306 extends forwardly from the forward surface of the front cylinder cap 288 and fits within a similarly-shaped, rearwardly-facing cylindrical recess 308 formed in a rearward facing surface of the stop plate 304, thereby aligning the stop plate 304 with the front cylinder cap 288. The stop plate 304 prevents the bushing 292 from moving longitudinally forward and out of the bore 290 of the front cylinder cap 288. A center hole 310 extends through the stop plate 304. The longitudinal connection rod 278 extends through the hole 310.

A hard stop collar 312 fits around the longitudinal connection rod 278. The stop collar 312 is used to control the amount of longitudinal rearward movement of the longitudinal connection rod 278 and the piston 272 within the cylinder 274. Rearward movement of the connection rod 278 brings the stop collar 312 into contact with the forward facing side of the stop plate 304, thereby limiting further longitudinal rearward movement of the connection rod 278 and the piston 272 within the cylinder 274. Adjusting the position of the stop collar 312 on the connection rod 278 adjusts the extent that the gripping and cutting subassembly 84 can be moved longitudinally rearward. The maximum amount of longitudinal rearward movement defines the distance that the leader 68 is pulled (FIG. 9C) to position the bulges 58 of the twist pin 50 in the vias 60 of the circuit bore 62 of the module 64 (FIGS. 4 and 9C-9F).

The hard stop collar 312 is generally of an annular configuration with a slot 314 formed radially through a wall of the collar 312. A center hole 316 is formed through the stop collar 312, and the longitudinal connection rod 278 extends through the center hole 316. An adjustment bolt 318 extends across the slot 314 between the portions of the stop collar 312 that are separated by the slot 314. Tightening the adjustment bolt 318 diminishes the distance across the slot 314 and slightly decreases the internal diameter of the center hole 316. Decreasing the internal diameter of the center hole 316 compresses the hard stop collar 312 at the center hole 316 around the connection rod 278 and thereby frictionally retains the stop collar 312 to the connection rod 278. Loosening the adjustment bolt 318 increases the diameter of the center hole 316 and allows the position of the stop collar 312 to be adjusted and moved longitudinally along the connection rod 278.

The position of the stop collar 312 along the longitudinal connection rod 278 is adjustable within the tool 80. As shown in FIG. 6, an adjustment opening 320 is formed in the front shell 92 by which to access the adjustment bolt 318. A tool which interacts with the adjustment bolt 318, such as a socket or an Allen wrench, is inserted through the opening 320, to loosen the adjustment bolt 318. Thereafter, the position of the stop collar 312 on the connection rod 278 is manually adjusted by moving the gripping and cutting subassembly 84 until the measured distance of the cutting wedges 130 and 132 from the guide member 134 is equal to the distance that the twist pin is to be pulled. The stop collar 312 is tightened to the connection rod 278 at this position with the stop collar 312 abutting the stop plate 304. In this manner, the rearward extent of pulling movement available from the longitudinal activator 270 is established.

The rear end of the longitudinal connection rod 278 is attached rigidly to the piston 272. The rear end of the connection rod 278 is threaded, and is connected to corresponding threads formed in axial bore 322 in the piston 272. The front end of the connection rod 278 is also threaded, and the front end threads connect with internal threads formed in a rearward-facing protrusion 323 of the rear cylinder cap 206 of the blade activator 144 (FIGS. 7, 10, 15, 17 and 19). In this manner, a longitudinally rigid connection extends between the piston 272 in the longitudinal activator 270 and the blade activator 144 of the gripping and cutting subassembly 84. Because of this rigid mechanical connection, the movement of the piston 272 within the cylinder 274 controls the longitudinal movement of the connection rod 278, as limited by the position of the stop collar 312 on the connection rod 278.

A rear cylinder cap 324 is attached to the rear end of the cylinder body 276. The rear cylinder cap 324 has a construction somewhat related to the construction of the front cylinder cap 288. The rear cylinder cap 324 includes a forward extending cylindrical projection 326. The cylindrical projection 326 has a slightly smaller outside diameter than the diameter of the cylinder 274, thereby allowing the forward extending cylindrical projection 326 to extend into the rear end of the cylinder 274. An annular shaped recess 328 extends circumferentially around the cylindrical projection 326 and holds a sealing ring 330. The sealing ring 330 creates a hermetic seal between the rear cylinder cap 324 and the cylinder body 276.

The rear cylinder cap 324 defines a bore 332 through which an extension tube 334 extends. A forward end of the extension tube 334 is attached to the piston 272 by a threaded connection. The extension tube 334 therefore moves longitudinally forward and backward with corresponding movement of the piston 272. The length of the extension tube 334 is sufficient to maintain a rear end of the extension tube 334 rearwardly outside of the rear cylinder cap 324, even when the piston 272 moves longitudinally forward to the maximum extent permitted by the front cylinder cap 288. The bore 332 in the rear cylinder cap 324 includes a bushing 336 which extends around and provides a guide for the extension tube 334. An internal annular shaped recess 338 is also formed within the bore 332, and an O-ring 340 is positioned in the recess 338. The O-ring 340 establishes a hermetic seal between the bore 332 and the extension tube 334 as the extension tube 334 slides longitudinally within the bore 332.

The longitudinal connection rod 278 is hollow and the extension tube 334 is hollow, as shown in FIG. 17-20. The axial bore 322 in the piston 278 aligns with the hollow interiors through the connection rod 278 and the extension tube 334. In this manner, an unobstructed internal passageway 341 extends along the center axis 138 through the longitudinal activator 270. The internal passageway 341 aligns with the internal passageway 246 through the blade activator 144 to conduct the severed leaders 68 from the conduction tube 140 through the longitudinal activator 270 and into the collection cup 99 of the interface and collection subassembly 88 (FIG. 7).

Figure 19:
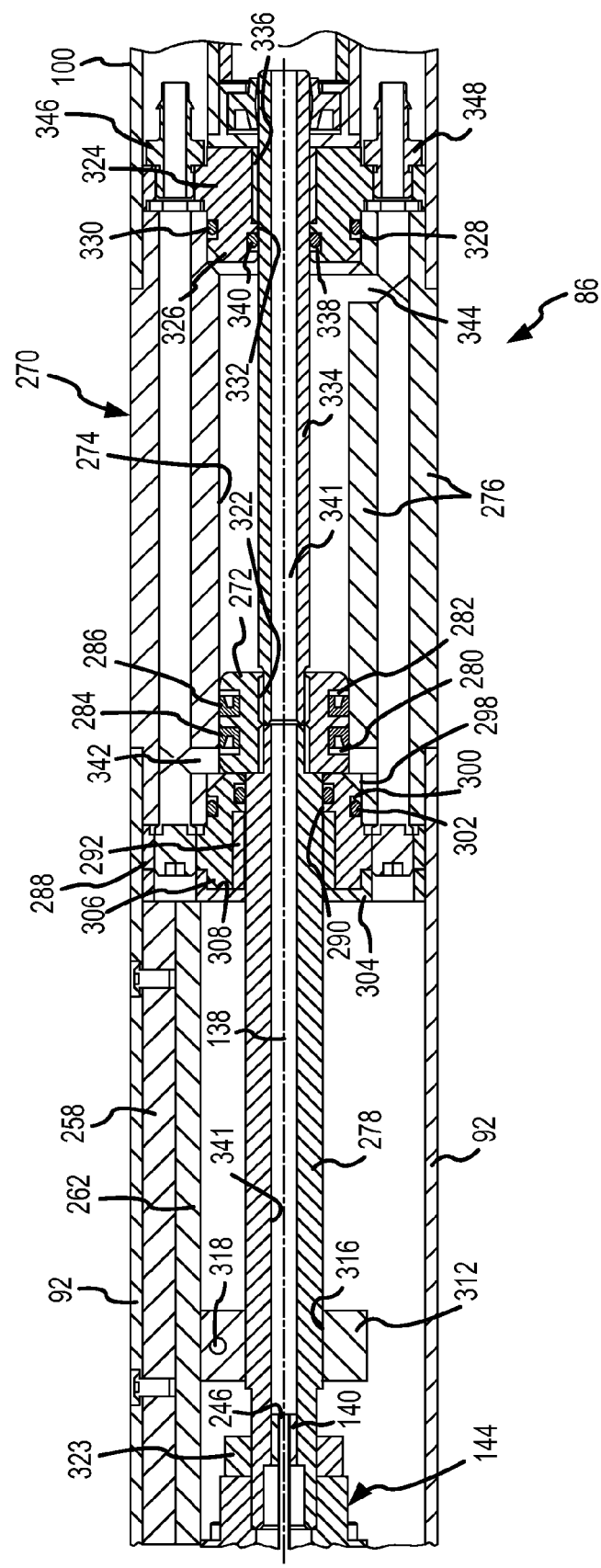
FIG. 19 is an enlarged horizontal and longitudinal cross sectional view of the longitudinal movement subassembly taken perpendicular to the view of FIG. 17 and substantially in the plane of line 19-19 in FIG. 7.
Figure 20:
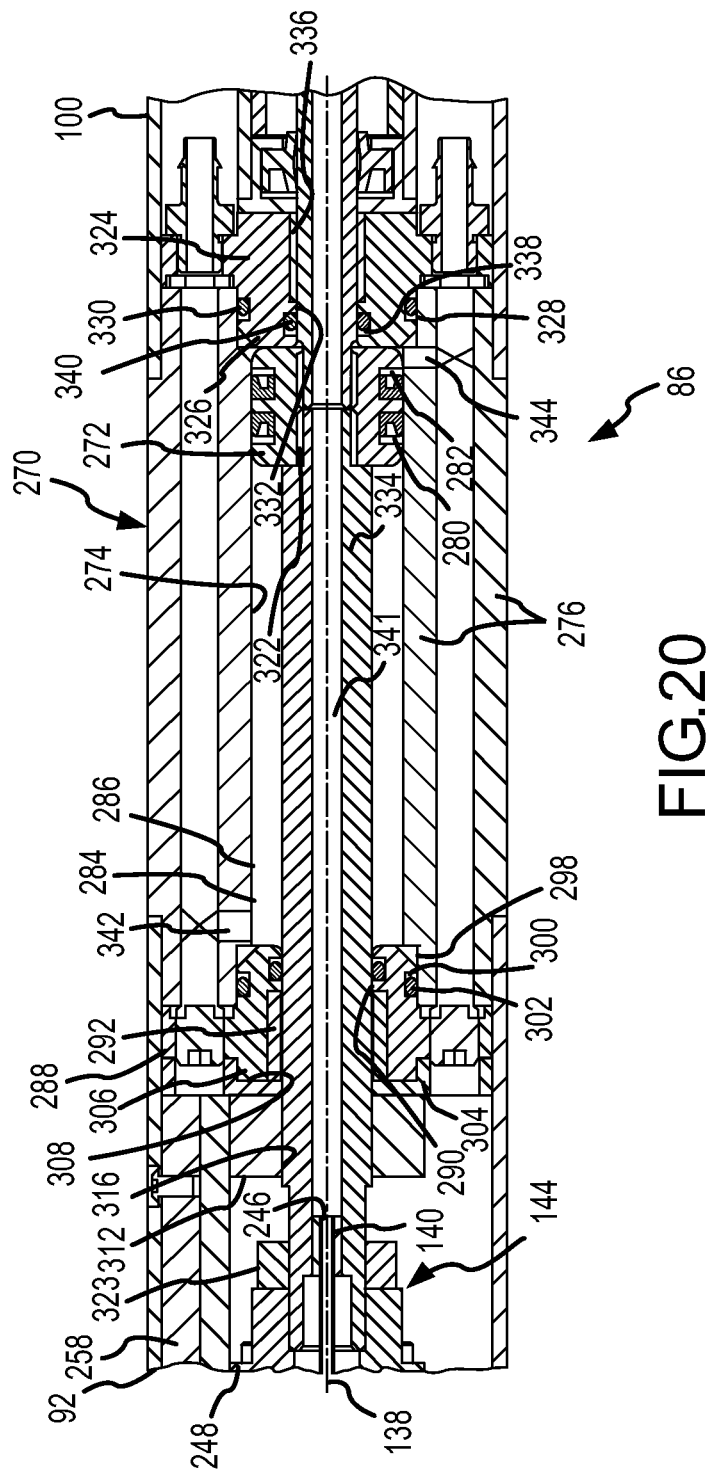
FIG. 20 is a cross sectional view similar to FIG. 19, with a longitudinal portion broken away, and with the piston positioned as shown in FIG. 18.

Compressed air for moving the piston 272 in the cylinder 274 is supplied through fluid passageways 342 and 344, shown in FIGS. 16, 19 and 20. The fluid passageways 342 and 344 extend longitudinally forward through the rear cylinder cap 324 and the cylinder body 276, and open into the cylinder 274 at positions which are located between the piston 272 and the cylindrical projection 298 of the front cylinder cap 288 and between the piston 272 and the cylindrical projection 326 of the rear cylinder cap 324, respectively. The passageways 342 and 344 are formed in the cylinder body 276 but are sealed where they enter the cylinder 274. Consequently, the passageways 342 and 344 define hermetically sealed paths for conducting the pressurized air into the cylinder 274. Pressurized air in the fluid passageway 342 enters the cylinder 274 between the front cap 288 and the piston 272 and forces the piston 272 rearwardly within the cylinder 274. The rearward movement of the piston moves the blade activator 144 and the other attached components of the gripping and cutting subassembly 84 rearwardly. This rearward movement occurs in conjunction with pulling the twist pin 50 (FIGS. 9A-9C) into the final assembled position. Pressurized air in the passageway 344 enters the cylinder 274 between the rear cap 324 and the piston and forces the piston 272 forwardly within the cylinder 274. The forward movement of the piston moves the blade activator 144 and the other attached components of the gripping and cutting assembly 84 forwardly. This forward movement occurs after the twist pin has been pulled into the final assembled position after which the pinch and cut blade 90 is moved forwardly to the location to sever the leader 68 from the remaining portion of the twist pin 50 (FIG. 9D).

Conventional hose fittings 346 and 348 are attached to the rear cylinder cap 324 to communicate with the fluid passageways 342 and 344, respectively. The hose fittings 346 and 348 connect to the pressure hoses 108 and 110 (FIG. 6) to conduct the pressurized air from those hoses into the fluid passageways 342 and 344, respectively. With the cylinder body 276 assembled into the tool 80, as shown in FIG. 6, the fluid passageways 342 and 344 are horizontally positioned on opposite transverse sides of the center axis 138 (FIGS. 19 and 20). Accordingly, the fluid passageways 342 and 344 occupy three o'clock and nine o'clock positions when the cylindrically-shaped cylinder body 276 is viewed from the rear end.

Figure 17:
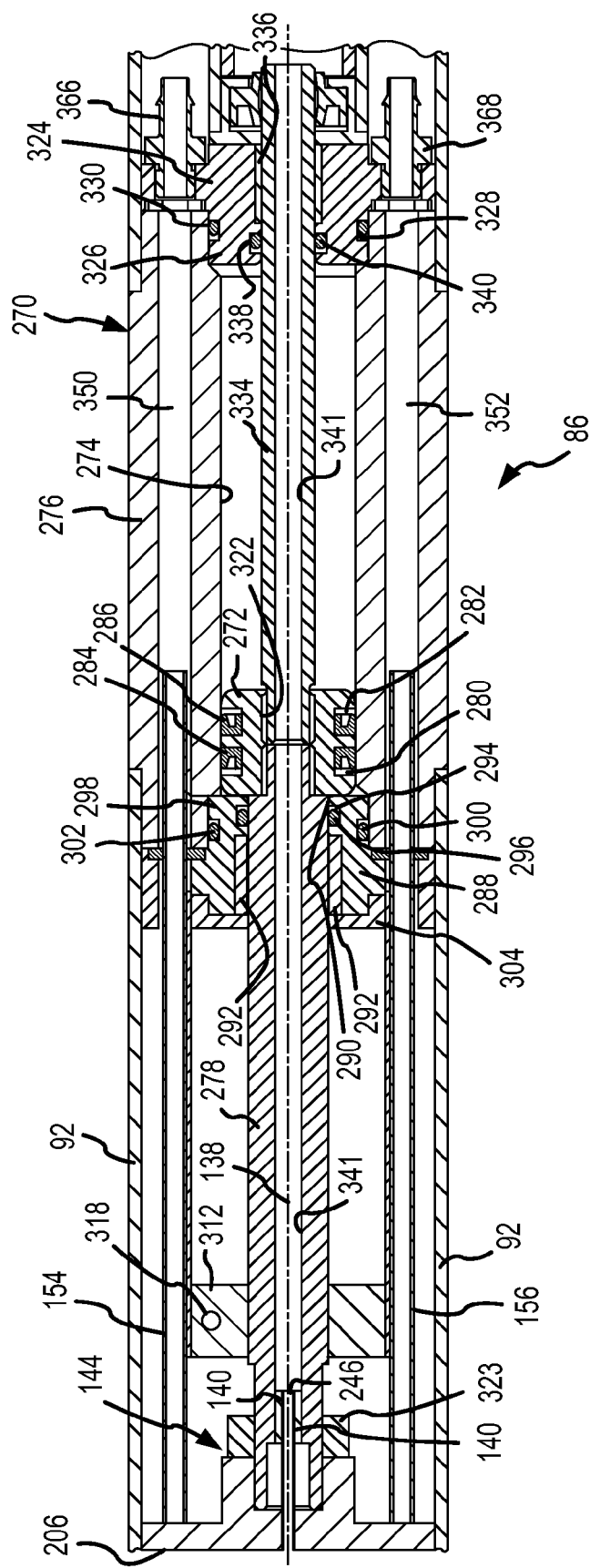
FIG. 17 is an enlarged vertical and longitudinal cross sectional view of the longitudinal movement subassembly taken substantially in the plane of line in 17-17 in FIG. 7, with a longitudinal portion broken away, and with a piston of the longitudinal movement subassembly in a forward position, resulting in movement of the gripping and cutting subassembly and the pinch and cut blade to the position shown in FIGS. 9A, 9D, 9E and 9F.
Figure 18:
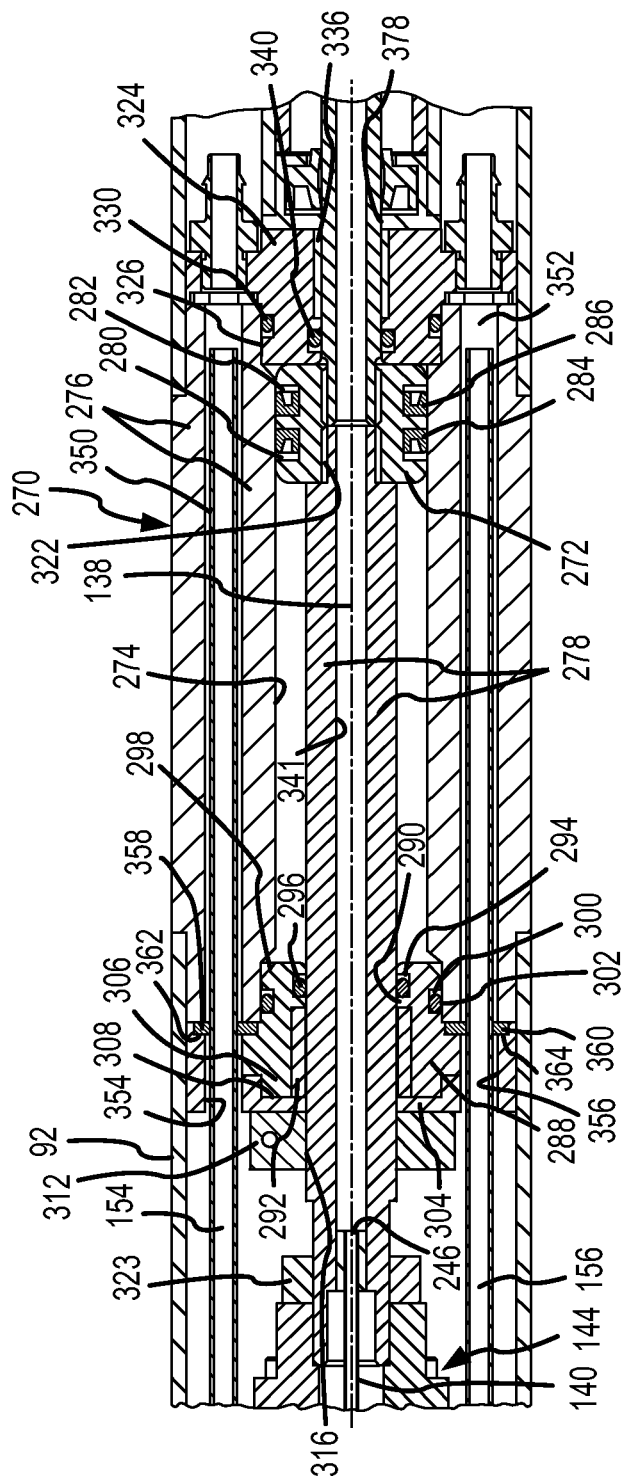
FIG. 18 is a cross sectional view similar to FIG. 17, with a piston of the longitudinal movement subassembly in a rearward position, resulting in movement of the gripping and cutting subassembly to the position shown in FIG. 9C.

Two additional fluid passageways 350 and 352 are formed longitudinally through the rear cylinder cap 324, the cylinder body 276 and the front cylinder cap 288 as shown in FIGS. 16, 17 and 18. The fluid passageways 350 and 352 are vertically positioned on opposite transverse sides of the center axis 138. The fluid passageways 350 and 352 therefore occupy the 12 o'clock and six o'clock positions when viewing the cylinder body 276 from the rear end. Holes 354 and 356 are formed through the stop plate 304 in alignment with the fluid passageways 350 and 352, respectively.

The rear ends of the tubes 154 and 156, which extend rearwardly from the blade activator 144, project through the holes 354 and 356 in the stop plate 304 and into the fluid passageways 350 and 352, respectively. O-rings 358 and 360 are positioned in annular grooves 362 and 364, respectively, formed in the front cylinder cap 288 surrounding the portion of the fluid passageways 350 and 352 which extend through the front cylinder cap 288. The O-rings 358 and 360 allow the upper and lower tubes 154 and 156 to slide longitudinally forward and rearward through the O-rings 358 and 360 while keeping the rearward ends of the tubes 154 and 156 in the passageways 350 and 352 and while maintaining a hermetic seal around the tubes 154 and 156. The passageways to 350 and 352 are formed in the cylinder body 276 but are sealed by the O-rings 358 and 360 to maintain a hermetic seal between the passageways 350 and 352 and the tubes 154 and 156.

Conventional hose fittings 366 and 368 are attached to the rear cylinder cap 324 to communicate with the fluid passageways 350 and 352, respectively. The hose fittings 366 and 368 connect to the pressure hoses 104 and 106 (FIG. 6) to conduct the pressurized air from those pressure hoses into the fluid passageways 350 and 352. The pressurized air in the passageways 350 and 352 is communicated through the tubes 154 and 156 to the blade actuator 144. Although not shown, O-rings may be positioned in circumferential grooves which surround the passageways 342, 344, 350 and 352 at the interfaces between the rear cylinder cap 324, the cylinder body 276 and the front cylinder cap 288, thereby maintaining hermetic seals between the components 324, 276 and 288 and the passageways 324, 344, 350 and 352 through those components.

Pneumatic Interface and Leader Collection Subassembly

The pneumatic interface and leader collection subassembly 88 is shown in FIGS. 7 and 21-24. The principal function of the subassembly 88 is to connect the pressurized air and vacuum supplied through the hoses 104-112 to the tool 80 and to collect the severed leaders 68 in a manner which does not interfere with the operation of the gripping and cutting subassembly 84 and the longitudinal movement subassembly 86. The operations of the interface and collection subassembly 88 are achieved primarily within the rear shell 100 to which the rear cap 102 is attached.

Figure 21:
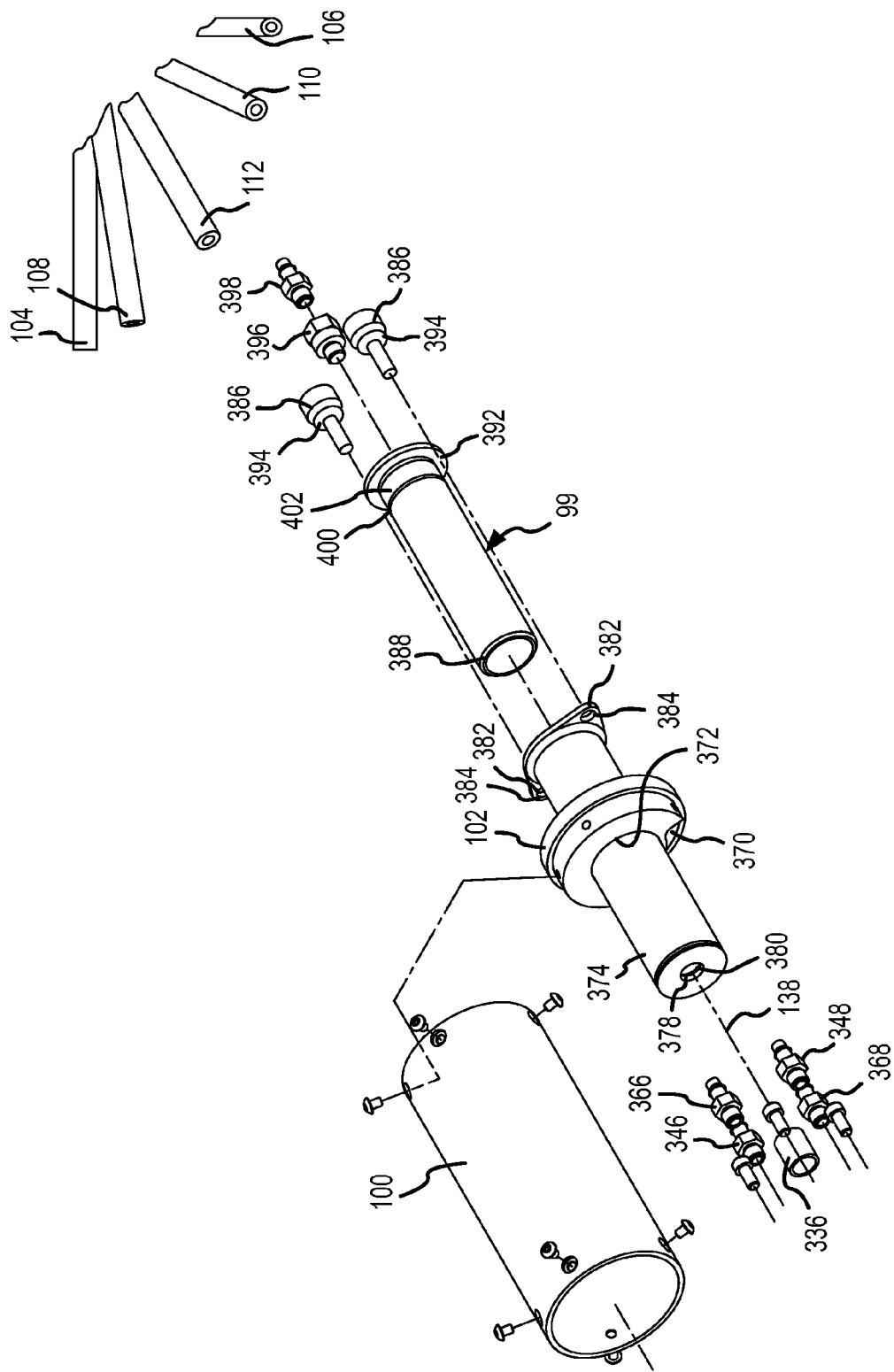
FIG. 21 is an exploded perspective view of the pneumatic interface and leader collection subassembly of the tool shown in FIG. 7.
Figure 22:
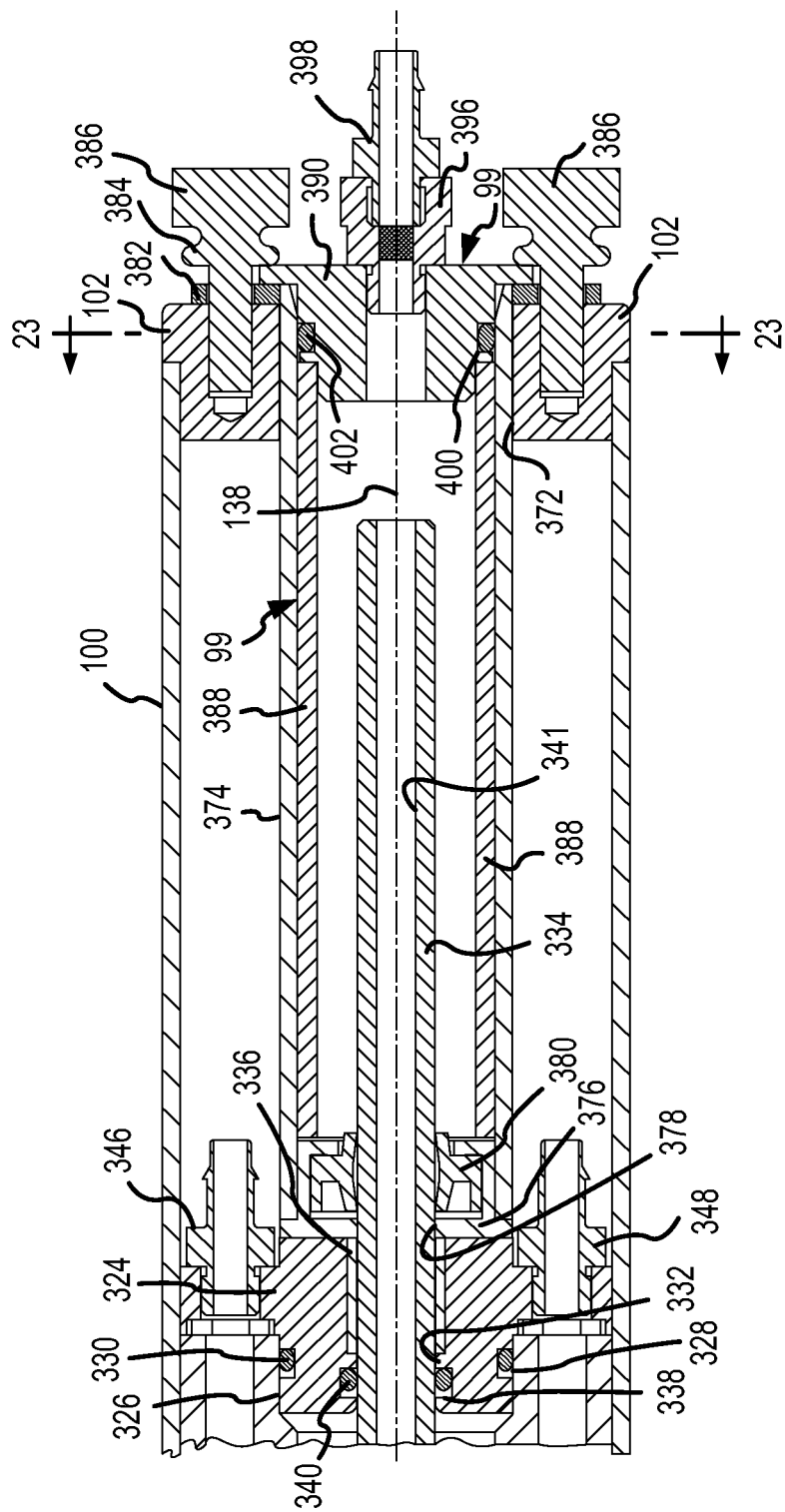
FIG. 22 is an enlarged horizontal and longitudinal cross sectional view of the pneumatic interface and leader collection subassembly taken substantially in the plane of line 22-22 in FIG. 7.
Figure 23:
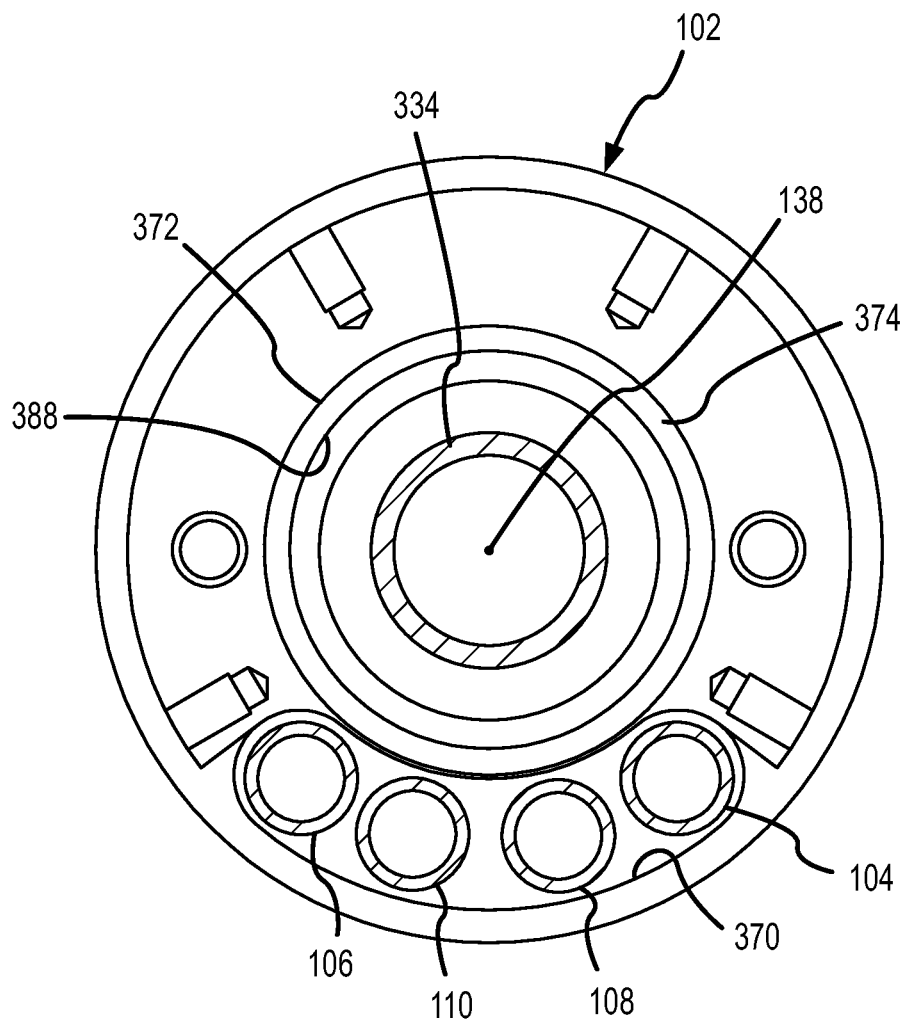
FIG. 23 is a transverse cross sectional view of the pneumatic interface and leader collection subassembly taken substantially in the plane of line 23-23 in FIG. 22.

A partial circumferential slot 370 is formed in the rear cap 102 at a location which is radially spaced from the center axis 138, as shown in FIGS. 21-23. The hoses 104-110 extend through the slot 370 into an interior space defined within the rear shell 100. Once within the interior of the rear shell 100, the forward ends of the hoses 104-110 connect to the hose fittings 346, 348, 366 and 368. In this manner, pressure hoses 104-110 pneumatically interface with the tool 80.

A center bore 372 is formed through the rear cap 102 coaxially with the center axis 138. An elongated cylindrically-shaped vacuum chamber 374 is inserted through the center bore 372. A forward end 376 of the chamber 374 has a hole 378 formed therein coaxially with the center axis 138. The hole 378 is slightly larger in diameter than the outside diameter of the extension tube 334. The rear end of the extension tube 334 extends through the hole 378 into the interior of the vacuum chamber 374. A flexible elastomeric seal 380 is positioned in the forward end 376 of the vacuum chamber 374. The seal 380 contacts and circumscribes the extension tube 334 to establish a hermetic seal between the extension tube 334 and the interior of the vacuum chamber 374, as the extension tube 334 moves forward and backward within the center bore 372. The seal 380 also functions as a wiper to scrape or dislodge severed leaders 68 collected in the collection cup 99 from contact with the extension tube 334. The forward end 376 of the vacuum chamber 374 contacts the rear cylinder cap 324 and prevents the bushing 336 from moving longitudinally rearward out of the bore 332 in the rear cylinder cap 324.

The vacuum chamber 374 is open at its rear end and throughout its interior from the open rear end to the closed forward end 376. A connection flange 382 (FIGS. 21 and 24) extends transversely outward from the vacuum chamber 374 at the open rear end. Mounting holes 384 are formed through the flange 382. Thumb screws 386 pass through the mounting holes 384 and screw into the rear cap 102.

The collection cup 99 is formed in the shape of an elongated cup with a cylindrically shaped sidewall 388 and a rear end plate 390 which closes the cylindrically shaped sidewall 388 at a rear end of the collection cup 99. The rear end plate 390 extends transversely outward beyond the sidewall 388 at the rear end of the collection cup 99 to create a flange 392. The flange 392 is captured under the tightened thumb screws 386 to hold the collection cup 99 in the vacuum chamber 374 and in the tool 80. The forward end of the cylindrical sidewall 388 is open. The sidewall 388 has an outside diameter that is slightly smaller than the inside diameter of the vacuum chamber 374, permitting the collection cup 99 to be inserted within the hollow interior of the vacuum chamber 374.

The collection cup 99 extends into the vacuum chamber 374 until its open front end is closely adjacent to the forward end 376 of the vacuum chamber 374. In the fully inserted position, the flange 392 of the collection cup 99 rests against the flange 382 of the vacuum chamber 374 at the rear surface of the rear cap 102. The thumb screws 386 include contact shoulders 394 (FIG. 21) which contact the collection cup flange 392 and apply axial force to the flange 392 to force it against the flange 382 of the vacuum chamber 374 and thereby retain the collection cup 99 within the vacuum chamber 374 and retain both the collection cup 99 in the vacuum chamber 374 within the interior of the rear shell 102 of the tool 80.

A filter 396 is connected through an opening formed in the end plate 390. A hose connection 398 is connected to the filter 396. The vacuum hose 112 is connected to the hose connection 398, at the exterior rear end of the tool 80. Vacuum pressure conducted through the hose 112 is thereby applied through the hose connection 398 and the filter 396 and into the interior of the collection cup 99. In this manner the vacuum hose 112 is interfaced with the tool 80.

An annular shaped recess 400 is formed in the sidewall 388 of the collection cup 99, and an O-ring 402 is retained by the recess 400. The O-ring 402 is radially compressed against the inner surface of the vacuum chamber 374 to create a hermetic seal between the collection cup 99 and the vacuum chamber 374. Consequently, the vacuum conducted through the hose 112 and into the interior of the collection cup 99 is also applied into the interior of the vacuum chamber 374, through the internal passageway 341 of the longitudinal activator 270, through the internal passageway 246 of the blade activator 144 (FIG. 15), and into the collection tube 140 (FIG. 14). The vacuum applied in this manner propels the severed leaders 68 from the pinch and cut blade 90 into the hollow interior of the collection cup 99. The filter 346 prevents the collected leaders 68 from entering into the vacuum hose 112 through the hose connection 396.

The severed leaders 68 accumulate in the collection cup 99 during the continued use of the tool 80 to assemble the twist pins 50 into the modules 64. When it is necessary to remove the severed leaders 68 from the collection cup 99, the thumb screws 386 are removed from the rear cap 102, and the collection cup 99 is removed from within the interior of the vacuum chamber 374. The severed leaders are then removed from the collection cup 99. Thereafter, the collection cup 99 is reassembled into the tool by inserting it into the vacuum chamber 374 and reattaching the thumb screws 386. The vacuum hose 112 connected to the hose connection 398 exhibits sufficient flexibility to permit the collection cup 99 to be removed from the tool 80 and maneuvered to remove the collected severed leaders, without disconnecting the hose 112 from the hose connection 398.

Control System

Figure 25:
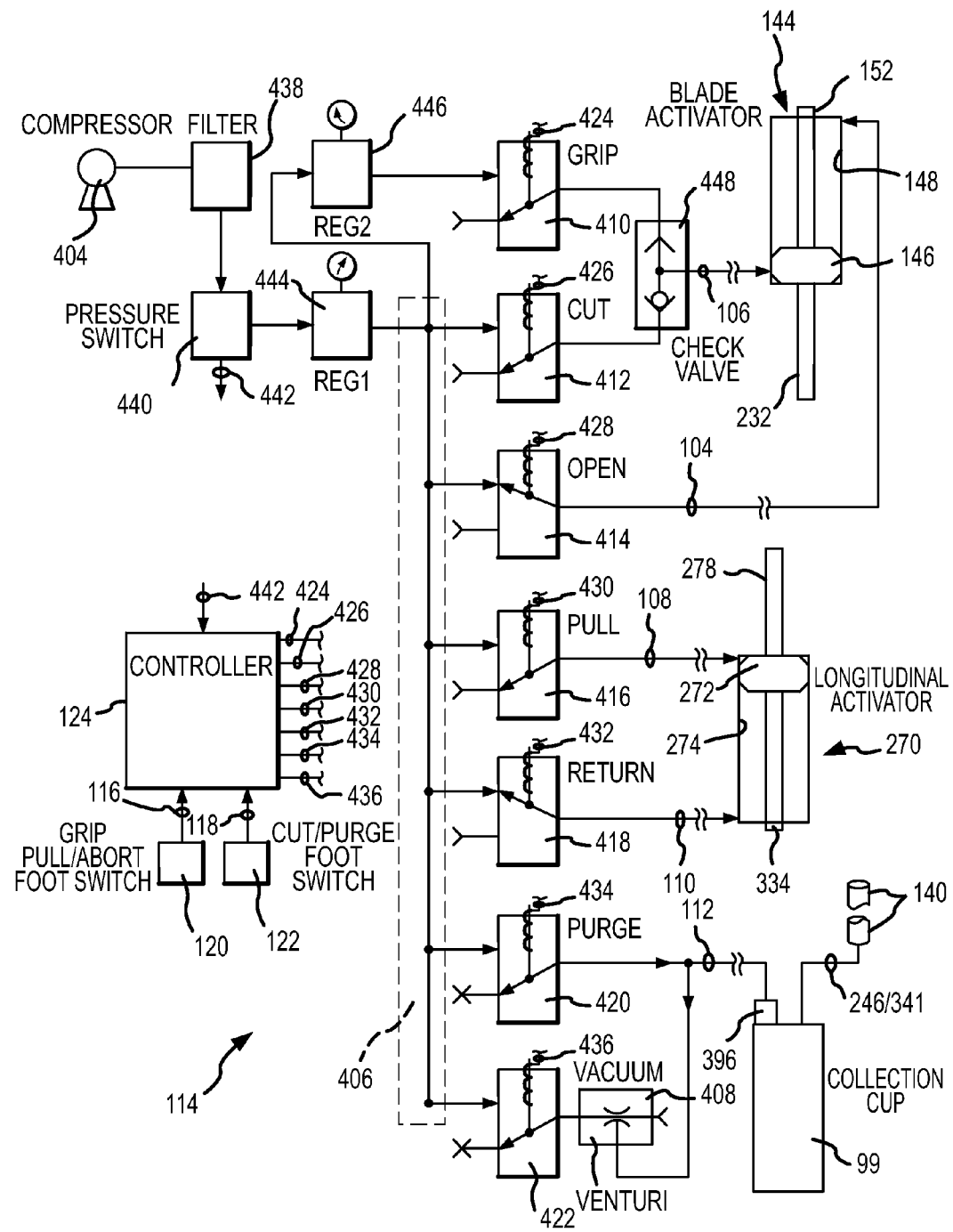
FIG. 25 is a schematic diagram of the pneumatic and electrical control system shown in FIG. 6.

The control system 114 for the tool 80 is shown in FIG. 25. The primary functions of the control system 114 are to create sources of pressurized air and sub-ambient pressure or vacuum which are used to operate the tool 80, and to control the application of the pressurized air and the vacuum to the tool 80 in response to activation of the foot switches 120 and 122 by the operator of the tool 80. The pressurized air is created by a conventional compressor 404. The pressurized air is supplied from the compressor 404 to a distribution manifold 406. The source of vacuum is created by flowing pressurized air from the distribution manifold 406 through a conventional venturi 408. Electrically controlled pneumatic solenoid valves 410, 412, 414, 416, 418, 420 and 422 assume and change flow states in response to solenoid control signals 424, 426, 428, 430, 432, 434 and 436 applied to the solenoids 410, 412, 414, 416, 418, 420 and 422, respectively, to conduct the pressurized air and the vacuum through the hoses 104, 106, 108, 110 and 112 to the tool 80. The control signals 424-436 are supplied by the controller 124 in response to the input control signals 116 and 118 from the foot switches 120 and 122, respectively.

The compressor 404 compresses ambient air and provides the compressed air at a relatively high output pressure level to a filter 438. The filter 438 removes particles that may be present in the compressed air supplied by the compressor 404. A pressure switch 440 is connected to sense the pressure of the relatively high pressure output air conducted through the filter 438. If the pressure drops below a predetermined minimum threshold, the pressure switch 440 sends a control signal 442 to the controller 124 and the controller ceases all operation of the tool 80. The controller 124 resets itself when adequate pressure is re-established, as determined by the signal 442. Upon resetting, the controller 124 sends solenoid control signals 424-436 to the solenoid valves 410-422 to establish an initial state of readiness of the tool 80 for assembling twist pins 50 into circuit modules 64.

The compressed air from the compressor 404 is supplied to a regulator 444 which reduces the high output pressure from the compressor 404 to a somewhat lower level within the distribution manifold 406. A second pressure regulator 446 is connected to the distribution manifold 406 and reduces the pressure of the air from the distribution manifold 406 even lower. The air pressure in the manifold 406 established by the regulator 444 is relatively higher than the relatively lower pressure established by the second pressure regulator 446. The relatively lower pressure air from the pressure regulator 446 is used to grip the leader 68 (FIGS. 9A-9C).

The solenoid valves 410-422 each have two pneumatic input ports and a single pneumatic output port. The two input ports are shown in FIG. 25 on the left-hand side of the solenoid valves 410-422, and the single output port is shown in FIG. 25 on the right-hand side of the solenoid valves 410-422. The upper one of the two input ports of the solenoid valves 412, 414, 416, 418, 420 and 422, as shown in FIG. 25, is directly connected to the manifold 406 to receive the relatively higher pressure from the manifold 406. The lower one of the two input ports of the solenoid valves 412, 414, 416 and 418, as shown in FIG. 25, is directly connected to ambient air pressure. The lower one of the two input ports of the solenoid valves 420 and 422, as shown in FIG. 25, is hermetically sealed so that no flow path and no pressure application may be communicated to or through the solenoid valves 420 and 422 from those input ports. The upper one of the two input ports of the solenoid valve 410, as shown in FIG. 25, is directly connected to the second pressure regulator 446, to receive the relatively lower pressure supplied by the pressure regulator 446. The lower one of the two input ports of the solenoid valve 410, as shown in FIG. 25, is directly connected to ambient air pressure.

Connected in the manner described in the preceding paragraph, turning on the solenoid valve 410 results in the solenoid valve 410 fluidly conducting the relatively lower pressure from the regulator 446 to a check valve 448. Turning off the solenoid valve 410 results in the solenoid valve 410 fluidly conducting atmospheric pressure to the check valve 448. Turning on the solenoid valve 412 results in the solenoid valve 412 fluidly conducting the relatively higher pressure from the manifold 406 to the check valve 448. Turning off the solenoid valve 412 results in the solenoid valve 412 fluidly conducting atmospheric pressure to the check valve 448. Turning on the solenoid valve 414 results in it fluidly conducting the relatively higher pressure from the manifold 406 to the hose 104. Turning off the solenoid valve 414 results in it fluidly conducting atmospheric pressure to the hose 104. Turning on the solenoid valve 416 results in it fluidly conducting the relatively higher pressure from the manifold 406 to the hose 108. Turning off the solenoid valve 416 results in it fluidly conducting atmospheric pressure to the hose 108. Turning on the solenoid valve 418 results in it fluidly conducting the relatively higher pressure from the manifold 406 to the hose 110. Turning off the solenoid valve 418 results in it fluidly conducting atmospheric pressure to the hose 110. Turning on the solenoid valve 420 results in it fluidly conducting of the relatively higher pressure from the manifold 406 to the hose 112. Turning off the solenoid valve 420 results in it not conducting any fluid or communicating any fluid pressure to the hose 112, because its lower input port (as shown in FIG. 25) is hermetically sealed. Turning on the solenoid valve 422 results in it fluidly conducting the relatively higher pressure from the manifold 406 to the venturi 408. The relatively higher pressure flowing through the venturi 408 creates a vacuum or subatmospheric pressure which is supplied to the hose 112. Finally, turning off the solenoid valve 420 results in it not conducting any fluid or communicating any fluid pressure to the venturi 408, because its lower input port (as shown in FIG. 25) is hermetically sealed.

The check valve 448 directs the higher of two different pressures applied to its two input ports to its output port. The lower of the two different pressures applied to one input port has no influence on the higher pressure applied to the other input port. The check valve 448 conducts the higher pressure and the accompanying fluid flow to the output port of the check valve 448. Thus, in the circumstance where the turned on solenoid valve 410 applies the relatively lower pressure from the regulator 446 to one input port of the check valve 448 and the turned off solenoid valve 412 applies ambient pressure to the other input port of the check valve 448, the check valve 448 conducts the relatively lower pressure from the regulator 446 to the hose 106. In the circumstance where the turned on solenoid valve 412 applies the relatively higher pressure from the distribution manifold 406 to one input port of the check valve 448 and the turned off the solenoid valve 410 applies ambient pressure to the other input port of the check valve 448, the check valve 448 conducts the relatively higher pressure from the distribution manifold 406 to the hose 106, and the relatively lower pressure from the regulator 446 has no influence on the relatively higher pressure conducted to the hose 106.

The solenoid valves 410, 412 and 414 are designated as a grip solenoid valve, a cut solenoid valve, and an open solenoid valve, respectively. Turning on and turning off the grip, cut and open solenoid valves 410, 412 and 414 control the movement of the piston 146 within the cylinder 148 of the blade activator 144 (FIGS. 10-15) to create the partially closed, closed and open positions of the pinch and cut blade 90, respectively.

When the operator steps on or activates the grip pull/abort foot switch 120, the control signal 116 is supplied to the controller 124, and the controller 124 delivers the solenoid control signals 424, 426 and 428 to the grip, cut and open solenoid valves 410, 412 and 414 to control the blade activator 144 and cause the pinch and cut blade 90 to grip the leader 68. The control signal 424 turns on the grip solenoid valve 410 to connect the relatively lower pressure compressed air from the regulator 446 to one input port of the check valve 448. The control signal 426 turns off the cut solenoid valve 426 and causes it to supply ambient pressure to the other input port of the check valve 448. Under these conditions, the relatively lower pressure from the regulator 446 is supplied through the hose 106 into the cylinder 148. The control signal 428 turns off the open solenoid valve 414 and causes it to supply ambient pressure through the hose 106 to the cylinder 148. The relatively higher pressure from the hose 104 and the ambient pressure from the hose 104 establish a pressure differential across the piston 146 which moves the piston 146 partially forward in the cylinder 148. The connection rod 152, which is connected to the piston 146, moves the blade deflecting mechanism 142 forward with only enough force to deflect the jaw members 126 and 128 so that the cutting wedges 130 and 132 (FIG. 13) pinch and grip the leader 68 of the twist pin 50 without severing it (FIGS. 9A-9C). The relatively lower output pressure from the regulator 446 is adjustable to control the extent to which the cutting wedges 130 and 132 pinch into of the leader 68 without severing it. Adjusting the amount of the relatively lower pressure air in this manner is useful to accommodate twist pins having different thicknesses.

When the operator steps on or activates the cut/purge foot switch 122, the control signal 118 is supplied to the controller 124, and the controller 124 delivers the solenoid control signals 424, 426 and 428 to the grip, cut and open solenoid valves 410, 412 and 414 to control the blade activator 144 to sever the leader 68. The control signal 426 turns on the cut solenoid valve 412 to connect the relatively higher pressure compressed air from distribution manifold 406 to one input port of the check valve 448. The control signal 424 turns off the grip solenoid valve 410 and causes it to apply ambient pressure to the other input port of the check valve 448. The relatively higher pressure conducted through the cut solenoid valve 412 is conducted by the check valve 448 through the hose 106 and into the cylinder 148. The control signal 428 turns off the open solenoid valve 414 and causes it to conduct ambient pressure air through the hose 106 and into the cylinder 148. The relatively higher pressure compressed air from the hose 104 and the ambient pressure from the hose 106 create a relatively greater pressure differential across the piston 146, compared to the pressure differential across the piston 146 when gripping the leader 68. The relatively greater pressure differential moves the piston 146 forward in the cylinder 148 to a greater extent. The connection rod 152 moves the blade deflecting mechanism 142 forward with enough force to deflect the jaw members 126 and 128 so that the cutting wedges 130 and 132 (FIG. 12) sever the leader 68 from the remaining portion of the twist pin 50 (FIG. 9E). The relatively higher output pressure from the regulator 444 is adjustable to obtain sufficient force on the cutting wedges 130 and 132 to sever the leader 68. Adjusting the amount of the relatively higher pressure air in this manner is useful to accommodate twist pins having different thicknesses.

The solenoid valves 416 and 418 are designated as a pull solenoid valve and a return solenoid valve, respectively. The pull and return solenoid valves 416 and 418 control the movement of the piston 272 within the cylinder 274 of the longitudinal activator 270 to move the gripping and cutting subassembly 84.

When the operator steps on or activates the grip pull/abort foot switch 120, the control signal 116 is supplied to the controller 124, and the controller 124 delivers the solenoid control signals 430 and 432 to the pull and return solenoid valves 416 and 418 to control the longitudinal activator 270 to move the gripping and cutting subassembly 84 longitudinally to pull the twist pin into the final assembled position and to return the subassembly 84 to the position for severing the leader 68. The control signal 430 turns on the pull solenoid valve 416 to connect the relatively higher pressure compressed air from the distribution manifold 406 through the hose 108 and into the cylinder 274. The control signal 430 turns off the return solenoid valve 418 to cause it to conduct ambient pressure through the hose 110 and into the cylinder 274. The resulting pressure differential moves the piston 272 rearward in the cylinder 274. The movement of the piston 272 within the cylinder 274 is transferred by the connection rod 278 to the gripping and cutting subassembly 84, and moves that subassembly 84 rearwardly away from the lower circuit board 62 of the module 64 (FIGS. 9B and 9C). During this rearward movement of the gripping and cutting subassembly 84, the leader 68 is gripped by the pinch and cut blade 90. Consequently, the leader 68 is pulled into position.

Shortly after the leader 68 is pulled into the assembled position (FIG. 9C), the controller 124 delivers the solenoid control signals 430 and 432 to the pull and return solenoid valves 416 and 418 to control the longitudinal activator 270 to return the gripping and cutting subassembly 84 to a position where the leader 68 can be severed. The control signal 432 turns on the return solenoid valve 418 and it conducts the relatively higher pressure compressed air from the distribution manifold 406, through the hose 110 and into the cylinder 274. The control signal 430 turns off the pull solenoid valve 416 and causes it to communicate ambient pressure through the hose 108 into the cylinder 274. The pressure differential on the piston 272 moves the piston forward within the cylinder 274, and the connection rod 278 transfers that motion to the gripping and cutting subassembly 84, thereby moving the subassembly 84 forward and toward the lower circuit board 62 of the module 64 (FIG. 9D).

The solenoid valves 420 and 422 are designated as a purge solenoid valve and a vacuum solenoid valve, respectively. The purge and vacuum solenoid valves 420 and 422 control the application of relatively high pressure and vacuum into the collection cup 99, respectively. The relatively high pressure and vacuum are communicated to the tool 80 through the hose 112. The vacuum communicated through the hose 112 transports the severed leader 68 away from the pinch and cut blade 90 of the gripping and cutting subassembly 84 (FIGS. 9E and 9F) and into the collection cup 99 in the manner previously described. The application of relatively high pressure to the collection cup 99 has the effect of clearing or purging any severed leaders or any other obstructions which might inadvertently remain within the conduction tube 140, the internal passageway 246 in the blade activator 144 (FIG. 14), and/or the internal passageway 341 in the longitudinal activator 270 (FIG. 17). Such obstructions would prevent transporting the next severed leader 68 into the collection cup 99, if those obstructions were not removed. The application of the relatively high pressure to the collection cup 99 clears any obstructions by transporting them in the reverse direction through the passageways 341 and 246 and out of the forward end of conduction tube 140 (FIGS. 14 and 17).

When the operator steps on or activates the cut/purge foot switch 122, the control signal 118 is supplied to the controller 124, and the controller 124 delivers the solenoid control signals 434 and 436 to the purge and vacuum solenoid valves 420 and 422 to apply vacuum to the collection cup 99. The control signal 436 turns on the vacuum solenoid valve 422 to conduct pressurized air through it to the venturi 408. The pressurized air flows through the venturi 408 and creates vacuum which is supplied through the hose 112 and into the collection cup 99. The vacuum is communicated from the collection cup 99 through the internal passageways 341 and 246 (FIGS. 14 and 17) and into the conduction tube 140, thereby removing the severed leader 68 (FIG. 9F). The control signal 434 turns off the purge solenoid valve 420. The turned off purge solenoid valve 420 does not adversely influence the vacuum applied through the hose 112 because of its communication to its hermetically sealed input port when turned off.

After completing the grip, pull, return and sever or cut operations involved in assembling a twist pin 50 into the module 64 (FIG. 4), or without completing a sever or cut operation, the controller 124 delivers the solenoid control signals 434 and 436 to the purge and vacuum solenoid valves 420 and 422 to apply relatively higher pressure air into the collection cup 99. The control signal 434 turns on the purge solenoid valve 420 to conduct the higher pressure air from the manifold 406 through the hose 112 and into the collection cup 99. The higher pressure air in the collection cup 99 is communicated through the internal passageways 246 and 341 and into the conduction tube 140 (FIGS. 14 and 17), thereby blowing out or purging any severed leader or other obstructions from within those passageways 246 and 341 and the conduction tube 140. The control signal 436 turns off the vacuum solenoid valve 422. The turned off vacuum solenoid valve 422 does not adversely influence the relatively high pressure applied through the hose 112 because of its communication to its hermetically sealed input port when turned off.

The controller 124 preferably includes or is constituted by a microprocessor or microcontroller which has been programmed to respond to the control signals 116, 118 and 442 in the manner described. In response, the controller 124 supplies the solenoid control signals 424-436 which have the described effect of controlling the application of the relatively high and relatively low pressure air and vacuum to the tool 80 to cause it to operate in the manner described. The functionality of the controller 124 in causing the tool 80 to execute the gripping, pulling, cutting and purging operations during the assembly of the twist pin 50 (FIGS. 9A-9F) are illustrated by a flow chart of the program sequence 450 shown in FIG. 26.

Program Flow Sequence

Figure 26:
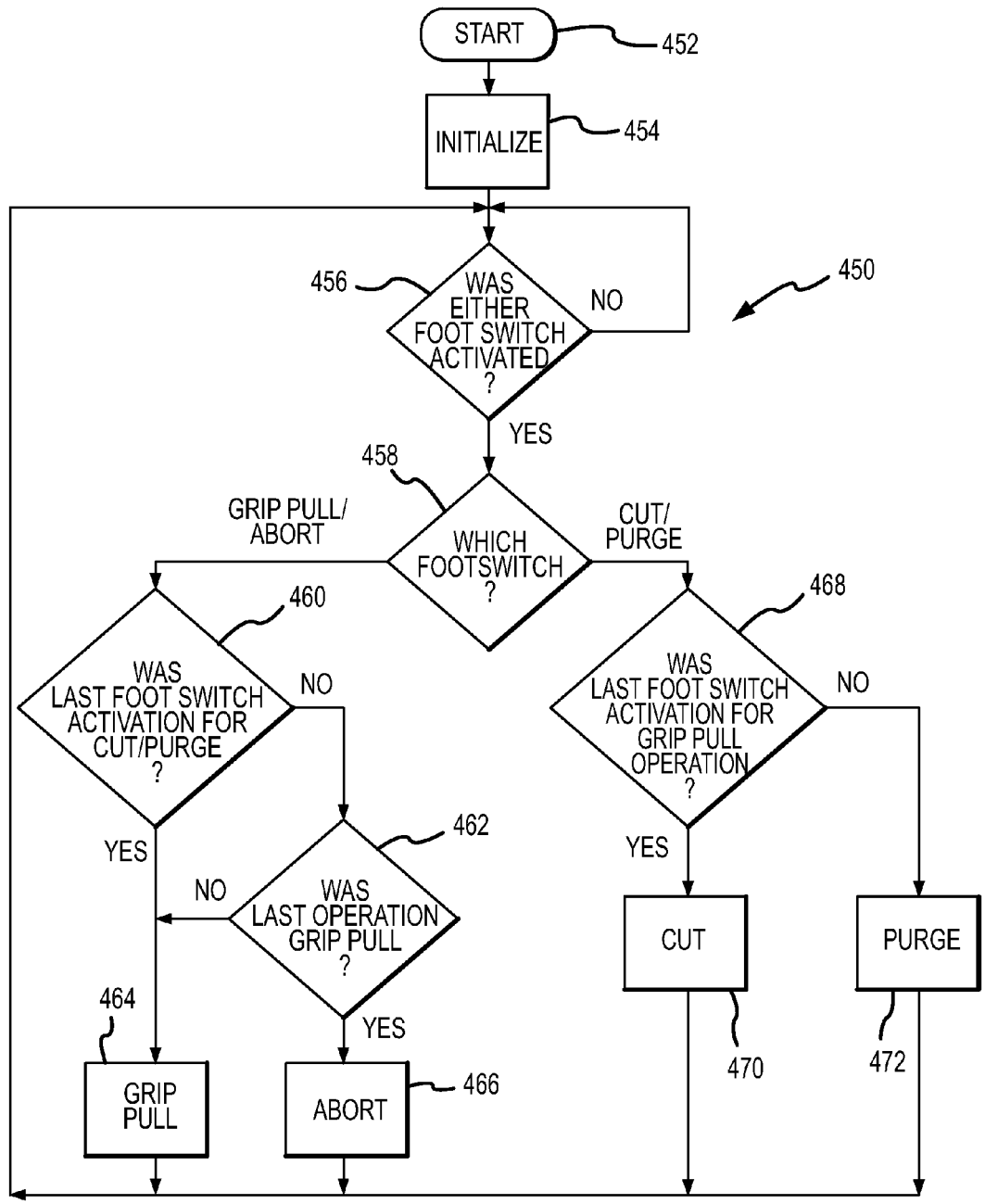
FIG. 26 is a flow chart of the programmed sequence of functions created by the control system shown in FIG. 25 to cause the tool shown in FIGS. 6 and 7 to perform the basic operations illustrated in FIGS. 9A, 9B, 9C, 9D, 9E and 9F.

The preferred sequence 450 of functions involved in operating and controlling the tool 80 is shown in FIG. 26. The sequence 450 is described in conjunction with the control system 114 shown in FIG. 25. Each of the steps or functions of the sequence 450 is identified by a reference number in FIG. 26.

The sequence 450 begins or starts at 452, after which the controller 124 operates all of the solenoid valves 410-422 of the control system 114 (FIG. 25) to the off position, thereby creating an initialized state 454. The initialized state at 454 places the tool 80 in a state of readiness for assembling a twist pin 50 into a circuit board module 64 by commencing a grip and pull operation 464, an abort operation 466, a cut operation 470 and a purge operation 472 involved in and available for use in assembling a twist pin 50 into a circuit board module 64.

From the initialized state 454, the sequence 450 progresses to a determination at 456 of whether one of the grip pull/abort or cut/purge foot switches 120 or 122 (FIGS. 6 and 25) has been pressed or activated by the operator. The controller 124 determines whether either foot switch 120 or 122 was activated at 456 by sensing the presence of either foot switch control signal 116 or 118 (FIG. 25). Until activation of either of the foot switch occurs, the sequence 450 is in a wait loop created by the negative determination at 456 leading to reconsideration of the foot switch activation condition determined at 456.

Pressing or activating the grip pull/abort foot switch 120 initiates a gripping and pulling operation 464 of the tool 80 in which the leader of the twist pin is gripped and the twist pin is thereafter pulled until the twist pin is in the desired inserted position within the circuit board module (FIGS. 9A-9C). Pressing or activating the grip pull/abort foot switch 120 also initiates an abort operation 466 of the tool 80 in which a previously inserted but not cut twist pin is gripped and pulled from its inserted position within the circuit board module without completing its assembly into the circuit board module. In essence, an abort operation 466 removes a previously inserted twist pin before the leader of that twist pin is cut to complete the assembly of the twist pin in the circuit board module.

Pressing or activating the cut/purge foot switch 122 initiates the cutting operation 470 in which the leader of the twist pin is cut off adjacent to the lowermost circuit board of the circuit board module and the severed leader is removed (FIGS. 9D-9F) from the conduction tube 140 and the internal passageways 246 and 341 and transferred into the collection cup 99 (FIGS. 14, 15, 17-21). Pressing or activating the cut/purge foot switch 122 also initiates a purge operation 472 in which the application of relatively high pressure has the effect of clearing or purging any severed leaders or any other obstructions which might inadvertently remain within the conduction tube 140, the internal passageway 246 in the blade activator 144 (FIG. 14), and/or the internal passageway 341 in the longitudinal activator 270 (FIG. 17). Such obstructions would prevent transporting the next severed leader 68 into the collection cup 99, if those obstructions were not removed. The purge operation 472 clears any obstructions by transporting them in the reverse direction through the passageways 341 and 246 and out of the forward end of conduction tube 140 (FIGS. 14 and 17).

Whenever one of the foot switches 120 or 122 is pressed or activated, an affirmative determination at 456 moves the sequence 450 out of the wait loop at 456 to a determination at 458. The determination at 458 identifies which of the foot switches 120 or 122 (FIG. 25) has been activated. The determination at 458 is made by the controller 124 in response to the asserted foot switch control signal 116 or 118 (FIG. 25) created by activation of the foot switch 120 or 122.

Activation of the grip pull/abort foot switch 120 moves the sequence 450 to 460 where another determination is made as to whether the last or preceding foot switch activation was an activation of the cut/purge foot switch 122 (FIG. 25). After the tool 80 has been placed in an initialized state at 454, the first determination at 460 is negative, since there is no previous activation of the foot switch from the initialized state. The program flow moves to 462 where another determination is made as to whether the last operation performed by the tool 80 was a grip pull operation. Again, since the tool is in the initialized state and there has been no previous operation of any type, the determination at 462 is negative. Under these circumstances, a grip pull operation is executed at 464. After completion of the grip pull operation 464, the sequence 450 reverts back to the determination at 456, awaiting another activation of a foot switch.

When previous operations have been performed by the tool 80, the sequence 450 reaches the determination 460 under circumstances where activation of one of the foot switches 120 or 122 has caused one of the operations 464, 466, 470 or 472 to have occurred previously. The determination at 460 allows the sequence 450 to progress to a grip and pull operation 464 only after a cut operation 470 or a purge operation 472, as recognized by an affirmative determination at 460. An affirmative determination at 460 establishes that the leader of the previously installed twist pin has been cut, and under such circumstances, another twist pin can be installed by the gripping and pulling operation 464.

Under circumstances where the previous operation was not a cut or purge operation resulting from activation of the cut/purge foot switch 122, the sequence 450 progresses from 460 to the grip and pull operation 464 only under the circumstances where the previous operation performed was not a grip and pull operation, as established by a negative determination at 462. In this case, the prior operation was an abort operation 466, or the first operation after initialization, and the negative determination at 462 allows the grip and pull operation 464 to be accomplished.

If the last operation executed was a grip pull operation, as established by an affirmative determination at 462, the sequence 450 executes an abort operation 466. The abort operation 466 provides the tool 80 with the capability to remove a twist pin from the circuit board module before it is completely installed and assembled into the circuit board module. For example, the wrong twist pin may have been inadvertently inserted into the circuit board module, or the inserted twist pin may be defective, or the inserted twist pin may be positioned improperly. Under these and other similar situations, the capability to remove a previously installed twist pin is desirable. The abort operation 466 is basically a grip pull operation which has the effect of pulling the twist pin from the circuit board module. Once pulled from the circuit board module, the twist pin must be removed from the tool 80, typically by executing a purge operation 472. After execution of the abort operation 466, the sequence 450 reverts back to 456.

Aborting the previous installation of a twist pin is accomplished by sequentially activating the grip pull/abort foot switch 120 a second time in sequence after first activating the grip pull/abort foot switch to accomplish a gripping and pulling operation 462 which installed the twist pin in the first instance and without activating the cut/purge foot switch. Under such circumstances, the second sequential activation of the grip pull/abort foot switch is detected at 456, and the sequence 450 is directed from the determination at 458 to the determination at 460. The determination at 460 is negative because no cut or purge operations have been performed. The next determination at 462 is affirmative, because the previous operation performed was the grip pull operation that resulted in the assembly of the twist pin in the circuit board module which is now desired to be removed. The affirmative determination at 462 results in the performance of an abort operation at 466.

The determination at 462 has the effect of toggling the operations performed by sequential activations of the grip pull/abort foot switch 120 between the grip and pull operation 464 and the abort operation 466. So long as the cut/purge foot switch 122 is not activated, the determination at 462 alternately causes a twist pin to be inserted by the gripping and pulling operation 464 or an inserted twist pin to be removed by an abort operation 466. Once the twist pin has been properly inserted, a cut and purge operation will be accomplished by activating the cut/purge foot switch 122.

When the operator of the tool 80 is satisfied that a twist pin has been properly inserted as a result of a grip and pull operation 464, the operator activates or presses the cut/purge foot switch 122. The activation of the foot switch 122 is sensed at 456, and activation of the cut/purge foot switch is detected at 458. At 468, it is determined whether the last activation of a foot switch was for a grip pull operation. Under circumstances of an affirmative determination at 468, a cut operation 470 is performed. The affirmative determination at 468 arises only under circumstances where the twist pin has been properly inserted in the circuit board module and thereafter it is desired to cut the leader of the twist pin. Under such circumstances, the cut operation is executed at 470 and the sequence 450 reverts back to 456.

In order to purge the severed leader from within the tool 80, or any other obstruction such as the twist pin removed during an abort operation 466, the cut/purge foot switch 122 is activated or pressed a second time in sequence after the first press has resulted in execution of the cut operation 470. The second sequential activation of the cut/purge foot switch 122 is recognized at 456 and is determined at 458 and leads to the determination at 468. In this case, a negative determination occurs at 468 because the previous activation of the cut/purge foot switch was to execute a cut operation 470. The negative determination at 468 results in execution of the purge operation 472.

After the first activation of the cut/purge foot switch 122 which leads to the cut operation 470, all subsequent sequential activations of that cut/purge foot switch will result in the accomplishment of purge operations at 472, due to the negative determination at 468. In other words, after the cut operation 470 has been performed and the grip pull/abort foot switch 120 has not been activated thereafter, all subsequent activations of the cut/purge foot switch 122 after a grip pull operation has been performed will result in performance of purge operations 472, until the grip pull/abort foot switch 120 has been activated and a grip pull operation 464 has been accomplished. In this manner, there is an assurance that a cut operation 470 will be performed only when a twist pin has been inserted into the circuit board module. All other activations of the cut/purge foot switch 122 result in purge operations 472, and this operation is beneficial in clearing obstructions even if multiple purge operations are required to do so, or is harmless if there is no obstruction to purge.

The grip pull, abort, cut and purge operations 464, 466, 470 and 472, respectively, and the initialization state 454, are accomplished by the controller 124 delivering the solenoid control signals 424-436 to the grip solenoid valve 410, the cut solenoid valve 412, the open solenoid valve 414, the pull solenoid valve 416, the return solenoid valve 418, the purge solenoid valve 420 and the vacuum solenoid valve 422, respectively, as shown in FIG. 25.

To perform the grip pull operation 464 (FIG. 26), the controller 124 sends the solenoid control signals to turn off the pull solenoid valve 416, to turn off the cut solenoid valve 412, to turn off the grip solenoid valve 410 and turn on the open solenoid valve 414. The controller 124 then executes a slight time delay and then sends the solenoid control signal to turn on the return solenoid valve 418, resulting in moving the open pinch and cut blade 90 into position for the gripping the leader 68 of the twist pin 50. Another time delay is executed, followed by the controller 124 sending solenoid control signals to turn off the open solenoid valve 414, to turn on the grip solenoid valve 410 and to turn off the return solenoid valve 418. Under these circumstances, the relatively lower pressure air passes through the turned-on grip solenoid valve 410 and the two-way check valve 448 to move the blade deflecting mechanism 142 (FIG. 13) and cause the cutting wedges 130 and 132 of the pull and cut blade 90 to pinch into and grip the leader 68 of the twist pin (FIG. 9A). After another slight time delay, the controller 124 sends a solenoid control signal to turn on the pull solenoid valve 416. The gripped leader 68 is pulled (FIG. 9B) as a result of the turned-on pull solenoid valve 416 moving the gripping and cutting subassembly 84 and the gripping cutting wedges 130 and 132 of the pinch and cut blade 90 to pull the twist pin 50 into place in the module 64 (FIG. 9C). Thereafter, the controller 124 executes another slight time delay, followed by sending control signals to turn off the grip solenoid valve 410 and to turn on the open solenoid valve 414. At this point, the functions of the grip and pull operation 464 are complete.

To perform the abort operation 466 (FIG. 26), the controller 124 sends solenoid control signals to turn off the grip solenoid valve 410, to turn off the cut solenoid valve 412, to turn on the open solenoid valve 414, to turn off the pull solenoid valve 416, and to turn on the return solenoid valve 418. Under these circumstances the pinch and cut blade 90 is returned to the position for gripping the leader which extends from the circuit board module. The controller 124 thereafter executes a slight time delay, followed by sending solenoid control signals to turn off the return solenoid valve 418 to turn off the open solenoid valve 414 and to turn on the grip solenoid valve 410. Under these circumstances the cutting wedges 130 and 132 of the pull and cut blade 90 pinch into and grip the leader of the twist pin. Another slight time delay is executed by the controller 124, followed by sending a solenoid control signal to turn on the pull solenoid valve 416. The turned-on pull solenoid valve 416 moves the gripping and cutting subassembly 84 and the gripping and cutting wedges 130 and 132 of the pinch and cut blade 90 to pull the twist pin completely out of the circuit board module. Another delay is executed, followed by sending solenoid control signals to turn off the pull solenoid valve 416 and to turn on the open solenoid valve 414. At this point, the functions occurring in the abort operation 464 are complete.

To perform the cut operation 470 (FIG. 26), the controller 124 sends solenoid control signals to turn off the grip solenoid valve 410, to turn off the cut solenoid valve 412, to turn off the pull solenoid valve 416 and to turn on the open solenoid valve 414. After executing a slight time delay, the controller 124 then sends a solenoid control signal to turn on the return solenoid valve 418. Under these circumstances, the pinch and cut blade 90 is moved to the position for cutting the leader which extends from the circuit board module (FIG. 9D). Another delay is executed, and the controller 124 thereafter sends solenoid control signals to turn off the open solenoid valve 414, to turn on the vacuum solenoid valve 422 and to turn on the cut solenoid valve 412. Under these conditions, the cutting wedges 130 and 132 of the pinch and cut blade 90 thereafter sever the leader (FIG. 9E) as a result of the turned-on cut solenoid valve 412. At this point, since the severed leader 68 is in the conduction tube 140, and the vacuum applied from the vacuum solenoid valve 422 starts transporting the leader 68 into the collection cup 99 (FIG. 21). The controller 124 executes another delay, followed by sending solenoid control signals to turn off the cut solenoid valve 412 and to turn on the open solenoid valve 414. Under these circumstances the cutting wedges 130 and 132 move away from one another (FIG. 9F). The vacuum remains on to continue transporting the severed leader to the collection cup, and that vacuum remains on during another time delay executed by the controller 124, thereby assuring that enough vacuum is produced to fully transport the severed leader into the collection cup. Finally, the controller 124 sends a solenoid control signal to turn off the vacuum solenoid valve 422. At this point, the functions occurring in the cut operation 470 are complete.

To perform the purge operation 472 (FIG. 26), the controller 124 sends solenoid control signals to turn off the cut solenoid valve 412, to turn off the grip solenoid valve 410, to turn on the open solenoid valve 414, to turn off the pull solenoid valve 416 and to turn on the return solenoid valve 418. Turning on the open solenoid valve 414 opens the pinch and cut blade 90 and turning on the return solenoid valve 418 moves the gripping and cutting subassembly 84 forward. The controller 124 thereafter executes a delay, followed by turning on the purge solenoid valve 420. The turned-on purge solenoid valve 420 blows compressed air through the collection tube 99 and the internal passageways 246 and 341 and the collection tube 140 (FIGS. 14, 17 and 22) to clear any severed leader, obstruction or aborted twist pin which might be present in those passageways. The controller 124 thereafter executes another time delay followed by sending a solenoid control signal to turn off the purge solenoid control valve 420. At this point, the functions occurring in the purge operation 472 are complete.

If at any time during the execution of the sequence 450, the controller 124 receives a low-pressure control signal 442 from the pressure switch 440, the controller 124 ceases functioning. Thereafter, controller 124 resets itself when adequate pressure is re-established. When the controller 124 resets, the initialization state 454 (FIG. 26) is achieved, and the sequence 450 then transitions from the initialization state 454 to the determination at 456 waiting for the activation of a foot switch 120 or 122 for continued functionality in the manner described above.

As has been described above, the pulling and cutting tool 80 combines the gripping, pulling and cutting operations necessary to position z-axis interconnectors in a three-dimensional module, into a single, relatively small, conveniently manipulated and mobile machine. The single tool 80 accomplishes all operations necessary to assemble a z-axis interconnect in a circuit module, thereby avoiding the use of separate machines for pulling the twist pins and for cutting the twist pins. The relatively compact size of the pulling and cutting tool allows it to be manipulated by hand, for convenient and quick assembly of the z-axis interconnectors. The use of large, immobile and expensive separate machines, which must be coordinated operationally with a complex control system, and which consume considerable space in an assembly line, is avoided. Despite its small size and manual positioning, the tool 80 achieves significant precision in pulling the twist pins to the desired position within the circuit module, by the precise movement available from the longitudinal activator 270 of the longitudinal movement subassembly 86. The precision available from the gripping and cutting subassembly 84 allows the leader 68 to be pinched so that it can be pulled but without severing the leader, but still severs the leader at the appropriate point in the sequence of assembly operations. The convenient operability of the tool 80 allows the user to assemble a relatively large number of the z-axis interconnectors into the circuit module relatively quickly, thereby saving manufacturing expenses. Many other advantages and improvements will become apparent upon fully appreciating the many benefits of the present invention.

A presently preferred embodiment of the present invention and many of its improvements have been described with a degree of particularity. This description is a preferred example of implementing the invention, and is not necessarily intended to limit the scope of the invention. The scope of the invention is defined by the scope of the following claims.

The invention claimed:

1. A method of assembling a z-axis interconnector into a plurality of aligned vias in a corresponding plurality of stacked printed circuit boards, the z-axis interconnector having a leader portion and a connection portion, the connection portion contacting the vias upon assembly of the interconnector in the aligned vias, the method comprising:
    inserting the leader portion of the z-axis interconnector through the aligned vias to establish a starting position in which a terminal end of the leader portion extends beyond an outer one of the plurality of printed circuit boards;
    gripping the terminal end of the leader portion with a pinch and cut device when the z-axis interconnector is in the starting position;
    pulling the leader portion to move the connection portion of the z-axis interconnector through the plurality of aligned vias to a final position in which the connection portion contacts the aligned vias, by moving the pinch and cut device away from the outer one of the printed circuit boards while gripping the terminal end of the leader portion with the pinch and cut device;
    releasing the grip on the terminal end of the leader portion with the pinch and cut device after the z-axis interconnector is in the final position;
    positioning the pinch and cut device adjacent to the outer one of the printed circuit boards after the z-axis interconnector has been pulled into the final position and after the grip on the terminal end of the leader portion is released; and thereafter
    severing the leader portion from the connector portion at a position adjacent to the outer one of the printed circuit boards by use of the pinch and cut device.

2. A method as defined in claim 1, further comprising:
    using opposing blades of the pinch and cut device to grip the leader portion; and
    penetrating the opposing blades partially into the leader portion to grip the leader portion.

3. A method as defined in claim 1, further comprising:
    using opposing blades of the pinch and cut device to sever the leader portion; and
    penetrating the opposing blades completely through the leader portion to sever the leader portion.

4. A method as defined in claim 1, further comprising:
    using opposing blades of the pinch and cut device to grip and sever the leader portion;
    penetrating the opposing blades partially into the leader portion to grip the leader portion;
    penetrating the opposing blades completely through the leader portion to sever the leader portion;
    separating the opposing blades laterally away from the leader portion to release the grip on the leader portion; and
    separating the opposing blades laterally from the leader portion prior to gripping the leader portion and after severing the leader portion.

5. A method as defined in claim 1, further comprising:
    inserting at least a part of the leader portion into a conduction tube in conjunction with positioning the pinch and cut device adjacent to the outer one of the printed circuit boards after the z-axis interconnector has been pulled into the final position; and
    transporting the severed leader portion through the conduction tube after severing the leader portion from the connection portion.

6. A method as defined in claim 1, further comprising:
    transporting the severed leader portion away from the connection portion immediately after severing the leader portion.

7. A method as defined in claim 6, further comprising:
    collecting a plurality of severed leader portions in a single location which is separated from the pinch and cut device, the plurality of the severed leader portions originating from a corresponding plurality of z-axis interconnectors assembled into the printed circuit boards.

8. A method as defined in claim 6, further comprising:
    creating a pressure along a path in which the severed leader portion is transported to the single location which is less than ambient pressure to transport the severed leader portion away from the connector portion to the collector location.

9. A method as defined in claim 1, further comprising:
    positioning the pinch and cut device at a predetermined location from the outer one of the printed circuit boards prior to pulling the leader portion.

10. A method as defined in claim 1, further comprising:
    accomplishing the gripping, pulling and severing with one pinch and cut device.

11. A method as defined in claim 10, further comprising:
    transporting the severed leader portion away from the connection portion immediately after severing the leader portion.

12. A method as defined in claim 11, further comprising:
    collecting a plurality of severed leader portions in a single location which is separated from the pinch and cut device, the plurality of the severed leader portions originating from a corresponding plurality of z-axis interconnectors assembled into the printed circuit boards.

13. A method as defined in claim 10, further comprising:
    inserting at least a part of the leader portion into a conduction tube in conjunction with positioning the pinch and cut device adjacent to the outer one of the printed circuit boards after the z-axis interconnector has been pulled into the final position; and
    transporting the severed leader portion through the conduction tube after severing the leader portion from the connection portion.

* * * * *